United States Patent
Kawamura et al.

(10) Patent No.: US 10,672,780 B1
(45) Date of Patent: Jun. 2, 2020

(54) THREE-DIMENSIONAL MEMORY DEVICE HAVING DUAL CONFIGURATION SUPPORT PILLAR STRUCTURES AND METHODS FOR MAKING THE SAME

(71) Applicant: SANDISK TECHNOLOGIES LLC, Addison, TX (US)

(72) Inventors: Takeshi Kawamura, Yokkaichi (JP); Akihisa Sai, Yokkaichi (JP); Naoki Ihata, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/284,240

(22) Filed: Feb. 25, 2019

(51) Int. Cl.
*H01L 27/11556* (2017.01)
*H01L 21/768* (2006.01)
(Continued)

(52) U.S. Cl.
CPC .. *H01L 27/11556* (2013.01); *H01L 21/76802* (2013.01); *H01L 23/528* (2013.01);
(Continued)

(58) Field of Classification Search
CPC ......... H01L 27/11556; H01L 27/11582; H01L 27/11565; H01L 27/11519; H01L 27/11575; H01L 27/11573; H01L 23/5226; H01L 23/528; H01L 23/481; H01L 21/76802; H01L 21/76831
USPC ........ 257/773, 314, 315, 321, 329, E21.135, 257/E21.41, E29.262; 365/185.05, 365/185.12, 185.18; 438/108, 261, 268
See application file for complete search history.

(56) References Cited

U.S. PATENT DOCUMENTS 5,915,167 A   6/1999 Leedy
9,576,967 B1  2/2017 Kimura et al.
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Dao H Nguyen
(74) *Attorney, Agent, or Firm* — The Marbury Law Group PLLC

(57) ABSTRACT

Memory openings and support openings are formed in a memory array region and a staircase region, respectively, through an alternating stack of insulating layers and spacer material layers. Pedestal channel portions and pedestal semiconductor portions are formed at the bottom of the memory openings and the support openings, respectively. Semiconductor oxide plates are provided only in a distal subset of the support openings that are spaced from the memory array region by more than a threshold separation distance. Memory openings are filled with memory opening fill structures, and support openings are filled with support pillar structures. Proximal support pillar structures located adjacent to the memory array region provide internal electrically conductive paths for discharging accumulated electrical charges. During an anisotropic etch process that forms the backside trench, the proximal support pillar structures prevent or reduce deformation of the backside trench, and reduce damage to the memory opening fill structures.

20 Claims, 37 Drawing Sheets

(51) Int. Cl.
  *H01L 23/522* (2006.01)
  *H01L 27/11565* (2017.01)
  *H01L 27/11582* (2017.01)
  *H01L 27/11519* (2017.01)
  *H01L 23/528* (2006.01)

(52) U.S. Cl.
  CPC .... *H01L 23/5226* (2013.01); *H01L 27/11519* (2013.01); *H01L 27/11565* (2013.01); *H01L 27/11582* (2013.01)

(56) References Cited

U.S. PATENT DOCUMENTS

| | | |
|---|---|---|
| 9,659,956 B1 | 5/2017 | Pachamuthu et al. |
| 9,754,958 B2 | 9/2017 | Pachamuthu et al. |
| 9,754,963 B1 * | 9/2017 | Kawamura ........ H01L 27/11582 |
| 9,842,851 B2 | 12/2017 | Pachamuthu et al. |
| 9,853,038 B1 | 12/2017 | Cui |
| 9,881,929 B1 | 1/2018 | Ravikirthi et al. |
| 9,905,573 B1 | 2/2018 | Mada et al. |
| 9,978,766 B1 | 5/2018 | Hosoda et al. |
| 10,014,316 B2 | 7/2018 | Yu et al. |
| 10,074,666 B2 | 9/2018 | Ge et al. |
| 10,103,169 B1 * | 10/2018 | Ge ................. H01L 27/11582 |
| 10,115,632 B1 | 10/2018 | Masamori et al. |
| 10,115,730 B1 | 10/2018 | Baraskar et al. |
| 10,141,331 B1 | 11/2018 | Susuki et al. |
| 10,304,852 B1 * | 5/2019 | Cui ..................... H01L 23/528 |
| 10,354,987 B1 * | 7/2019 | Mushiga ............... H01L 23/481 |
| 10,381,369 B2 * | 8/2019 | Kim .................. H01L 27/11568 |
| 2017/0062454 A1 * | 3/2017 | Lu .................... H01L 21/32055 |
| 2017/0125437 A1 | 5/2017 | Pachamuthu et al. |
| 2017/0125438 A1 | 5/2017 | Pachamuthu et al. |
| 2017/0179154 A1 * | 6/2017 | Furihata ............ H01L 27/11524 |
| 2018/0061850 A1 | 3/2018 | Mada et al. |
| 2018/0108671 A1 | 4/2018 | Yu et al. |
| 2018/0130812 A1 | 5/2018 | Hosoda et al. |
| 2018/0197876 A1 | 7/2018 | Ge et al. |
| 2018/0261613 A1 | 9/2018 | Ariyoshi et al. |
| 2018/0301374 A1 | 10/2018 | Masamori et al. |
| 2018/0342531 A1 | 11/2018 | Susuki et al. |
| 2019/0280000 A1 * | 9/2019 | Nakamura .......... H01L 29/1037 |

OTHER PUBLICATIONS

U.S. Appl. No. 15/715,629, filed Sep. 26, 2017, SanDisk Technologies LLC.
U.S. Appl. No. 15/840,090, filed Dec. 13, 2017, SanDisk Technologies LLC.
U.S. Appl. No. 15/943,859, filed Apr. 3, 2018, SanDisk Technologies LLC.
U.S. Appl. No. 16/021,749, filed Jun. 28, 2018, SanDisk Technologies LLC.
U.S. Appl. No. 16/021,831, filed Jun. 28, 2018, SanDisk Technologies LLC.

* cited by examiner

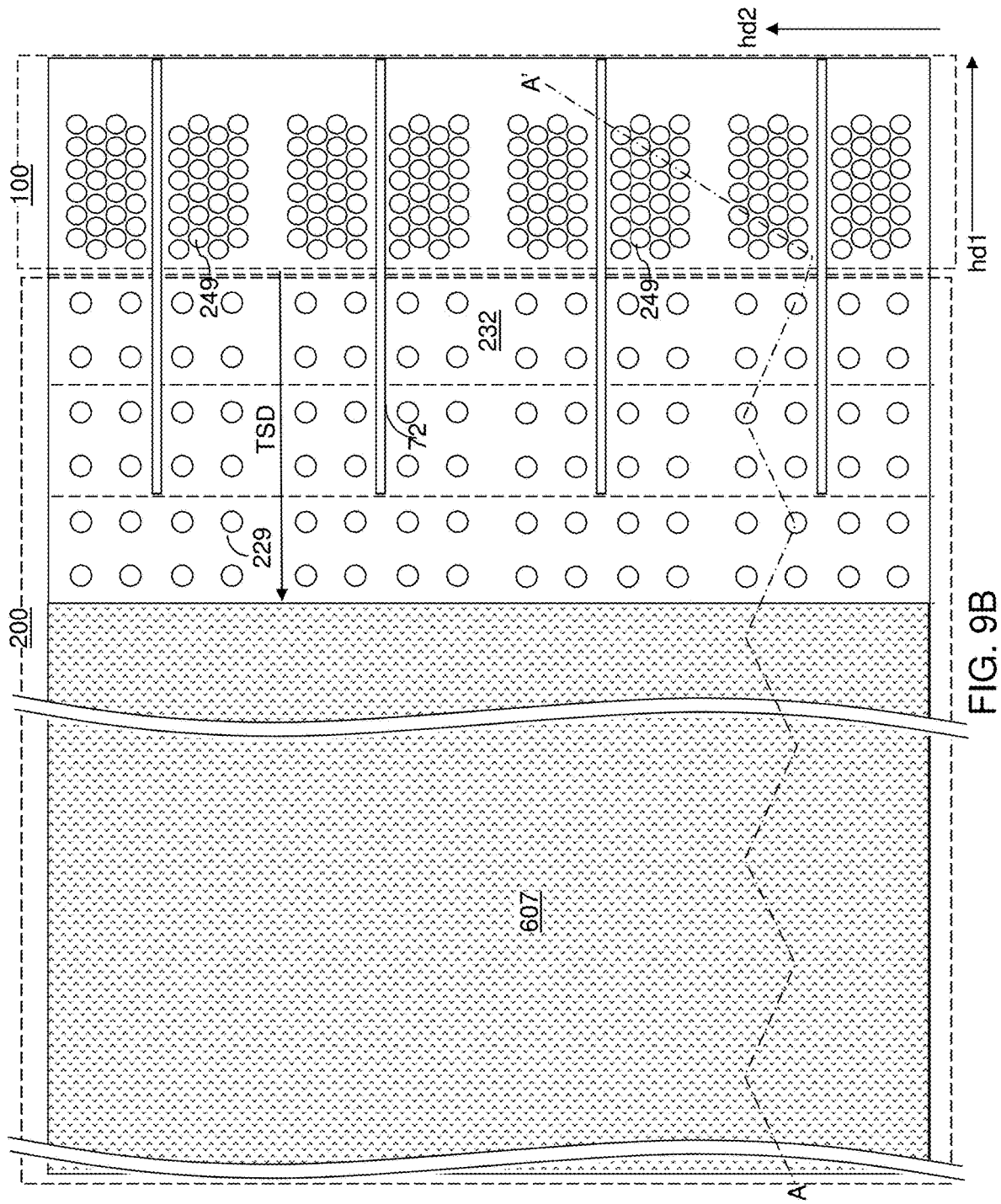

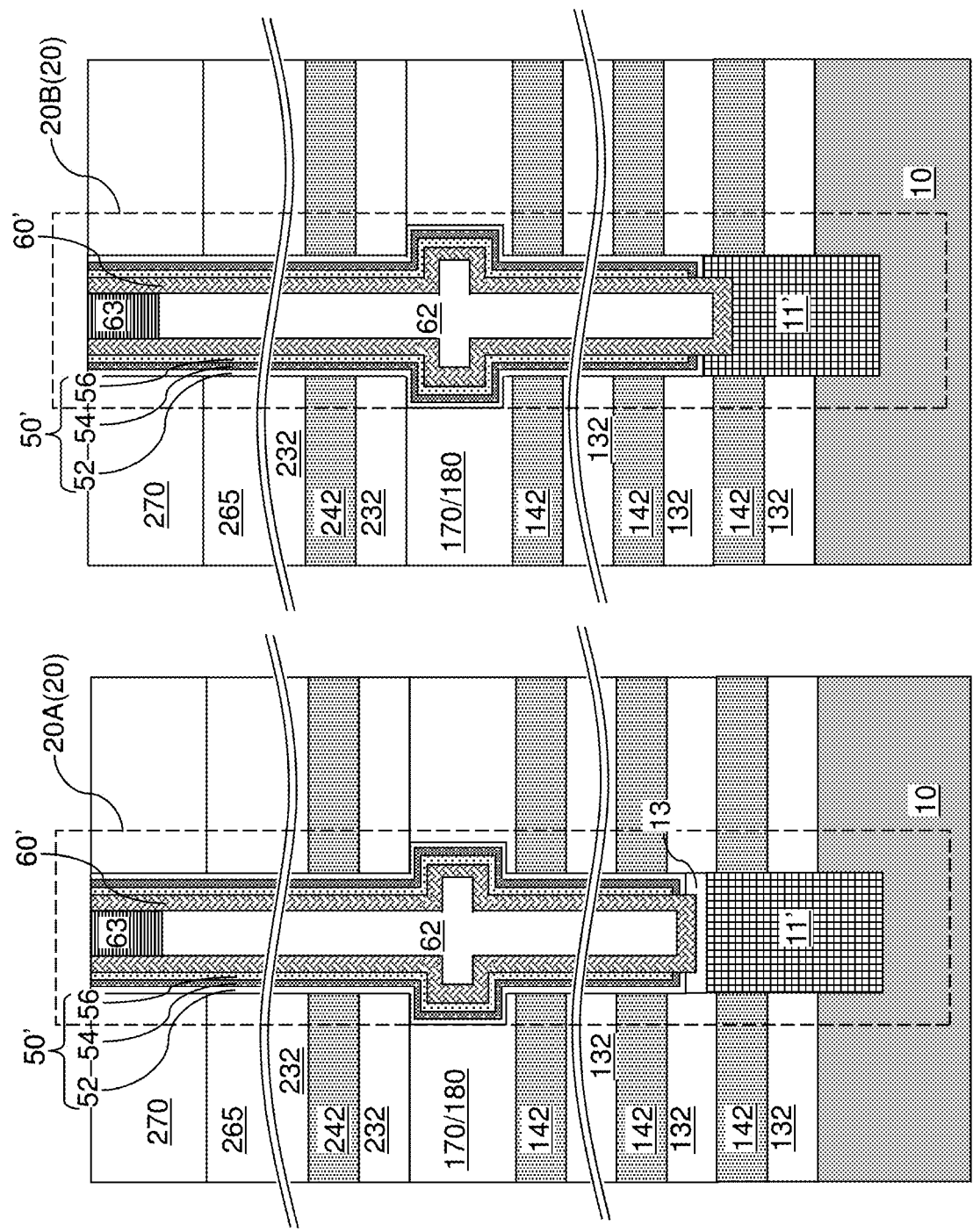

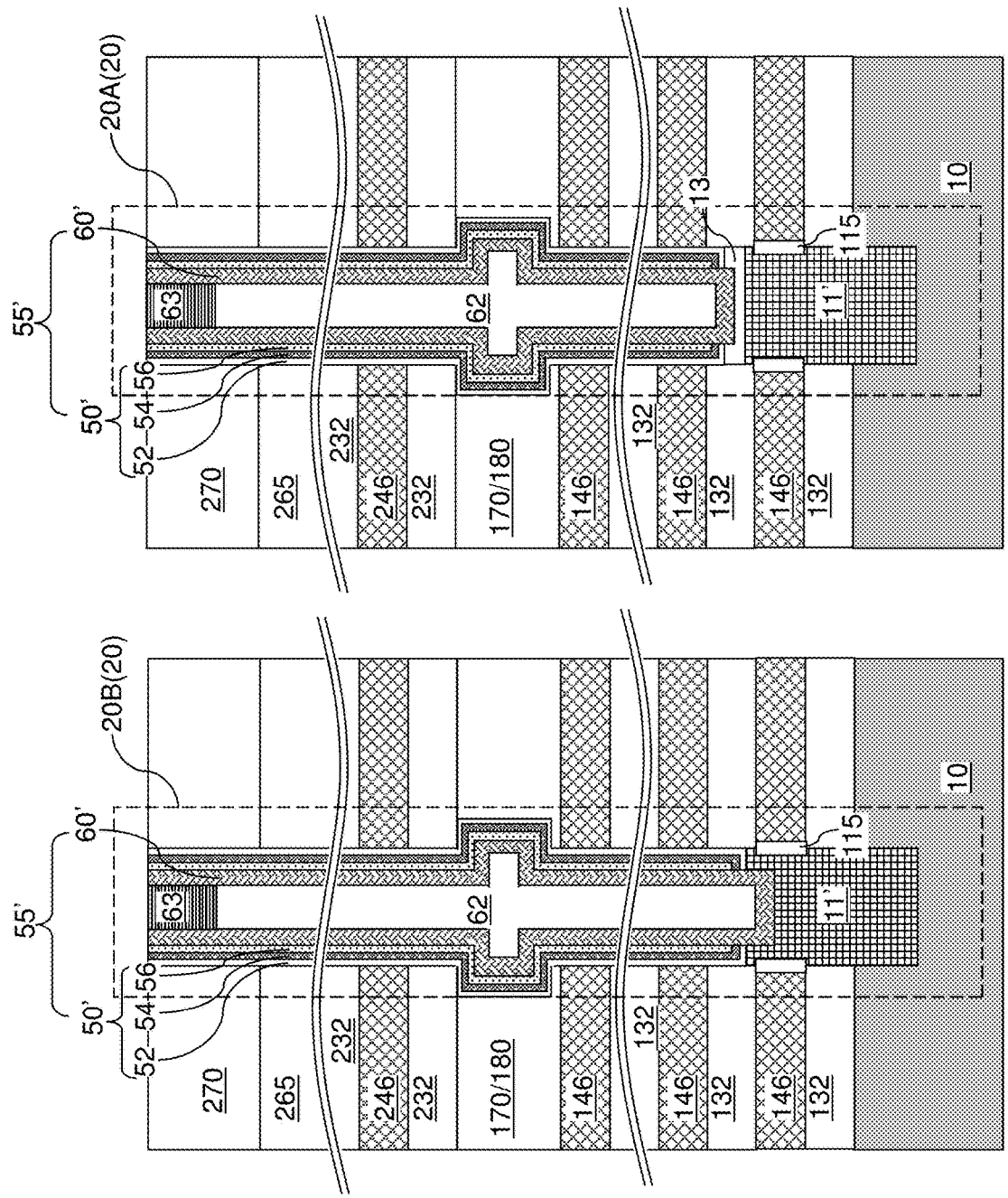

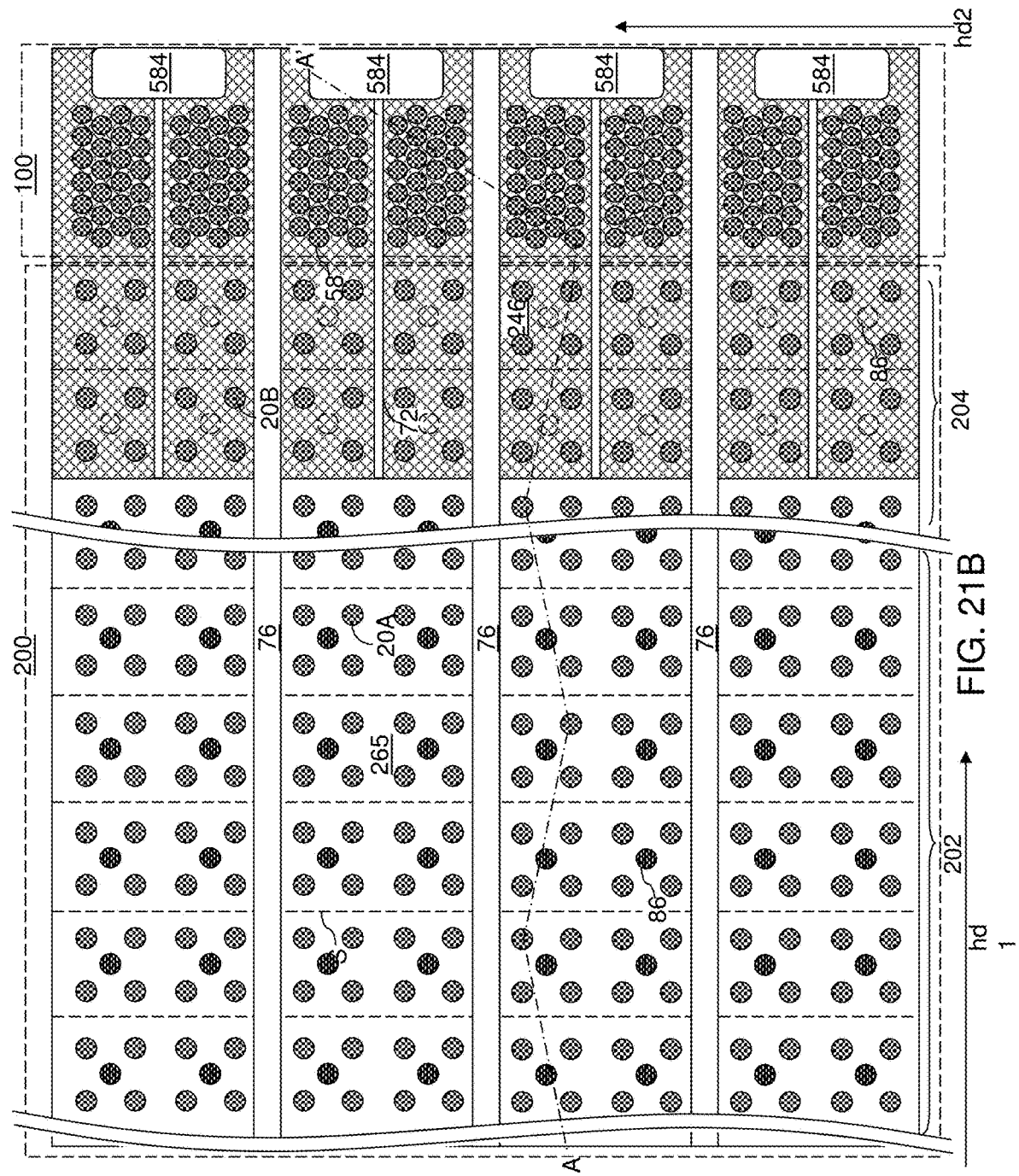

THREE-DIMENSIONAL MEMORY DEVICE HAVING DUAL CONFIGURATION SUPPORT PILLAR STRUCTURES AND METHODS FOR MAKING THE SAME

FIELD

The present disclosure relates generally to the field of semiconductor devices, and particular to a three-dimensional memory device using dual configuration support pillar structures and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate and having stepped surfaces in a staircase region; a retro-stepped dielectric material portion overlying the stepped surfaces of the alternating stack in the staircase region; memory opening fill structures extending through the alternating stack in a memory array region, wherein each of the memory opening fill structures comprises a memory stack structure comprising a semiconductor channel and a memory film; first support pillar structures extending through the alternating stack and the retro-stepped dielectric material portion in a first section of the staircase region; and second support pillar structures extending through the alternating stack and the retro-stepped dielectric material portion in a second section of the staircase region, wherein each of the first support pillar structures and the second support pillar structures comprises a respective pedestal semiconductor portion and a respective dielectric layer stack overlying the respective pedestal semiconductor portion; wherein each pedestal semiconductor portion of the first support pillar structures is vertically spaced from an overlying one of the dielectric layer stacks by a respective semiconductor oxide plate; and wherein each pedestal semiconductor portion of the second support pillar structures directly contacts a bottom surface of an overlying one of the dielectric layer stacks.

According to another embodiment of the present disclosure, a method of forming a three-dimensional memory device is provided, which comprises the steps of: forming an alternating stack of insulating layers and spacer material layers over a substrate; patterning the alternating stack to form stepped surfaces in a staircase region; forming a retro-stepped dielectric material portion over the stepped surfaces of the alternating stack in the staircase region; forming memory opening and support openings through a combination of the alternating stack and the retro-stepped dielectric material portion, wherein the memory openings are formed in a memory array region in which each layer of the alternating stack is present, and wherein the support openings are formed in the staircase region; forming a pedestal semiconductor portion at a bottom of each support opening and a pedestal channel portion at a bottom of each memory opening; forming a semiconductor oxide plate on top of each of the pedestal semiconductor portions and the pedestal channel portions; removing semiconductor oxide plates that are located in the memory openings and in a proximal subset of the support openings laterally spaced from the memory array region by less than a threshold separation distance without removing semiconductor oxide plates that are located in a distal subset of the support openings laterally spaced from the memory array region by a distance greater than the threshold separation distance; and forming first support pillar structures in the distal subset of the support openings and second support pillar structures in the proximal subset of the support openings.

BRIEF DESCRIPTION OF THE DRAWINGS

FIG. 9B is a top-down view of the exemplary structure of FIG. 9A.

FIGS. 11A-11D are sequential vertical cross-sectional views of a first support opening that is laterally spaced from the memory array region by a distance greater than a threshold separation distance during formation of a first support pillar structure according to an embodiment of the present disclosure.

FIGS. 12A-12D are sequential vertical cross-sectional views of a second support opening that is laterally spaced from the memory array region by a distance less than a threshold separation distance during formation of a second support pillar structure according to an embodiment of the present disclosure.

FIG. 19C is a vertical cross-sectional view of a first support pillar structure at the processing steps of FIGS. 19A and 19B.

FIG. 19D is a vertical cross-sectional view of a second support pillar structure at the processing steps of FIGS. 19A and 19B.

FIG. 21B is a horizontal cross-sectional view of the exemplary structure along the vertical plane B-B' of FIG. 21A. The hinged vertical plane A-A' corresponds to the plane of the vertical cross-sectional view of FIG. 21A.

DETAILED DESCRIPTION

Figure 1:
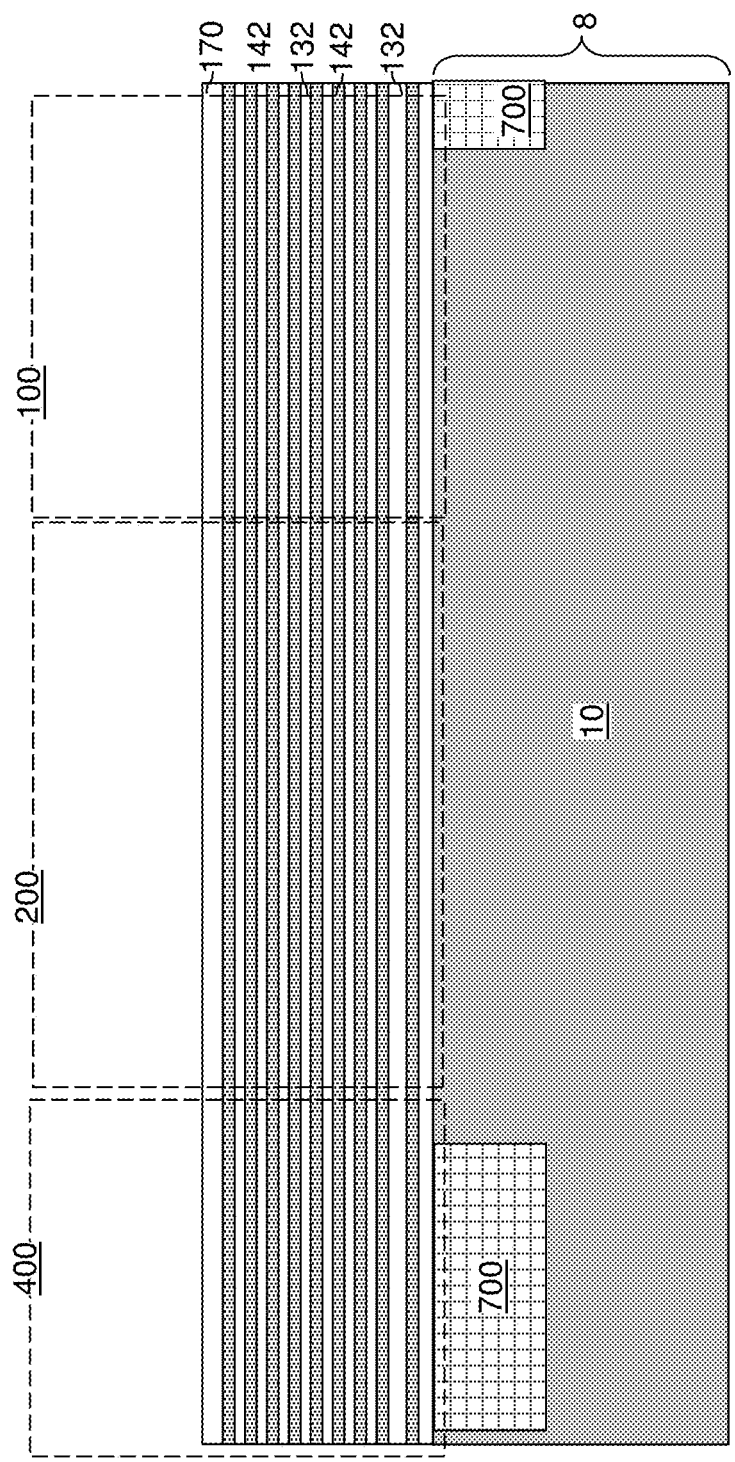
FIG. 1 is a vertical cross-sectional view of an exemplary structure after formation of a first-tier alternating stack of first insulting layers and first spacer material layers according to an embodiment of the present disclosure.

In a three-dimensional memory device, backside trenches may be formed through an alternating stack of insulating layers and sacrificial material layer to provide replacement of the sacrificial material layers with electrically conductive layers (e.g., word lines). Support pillar structures may be used in a staircase region to prevent collapse of the alternating stack during replacement of the sacrificial material layers with the electrically conductive layers. Deformation and/or over etching of the alternating stack during formation of the backside trenches and the support pillar structures induce leakage current through the support pillar structures. The embodiments of the present disclosure provide a three-dimensional memory device using dual configuration support pillar structures and methods of manufacturing the same, which reduce the leakage current, the various aspects of which are described herein in detail. The embodiments of the present disclosure may be used to form various semiconductor devices such as three-dimensional monolithic memory array devices comprising a plurality of NAND memory strings. The drawings are not drawn to scale.

Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which includes a substrate 8, which includes a substrate semiconductor layer 10. The substrate 8 may comprise a commercially available semiconductor wafer such as a single crystalline silicon wafer, and the substrate semiconductor layer 10 may be a single crystalline semiconductor material layer such as a single crystalline silicon layer.

The substrate semiconductor layer 10 is a doped semiconductor layer having a doping of a first conductivity type, which may be p-type or n-type. The substrate semiconductor layer 10 may include electrical dopants of the first conductivity type at an atomic concentration in a range from $1.0\times10^{14}/cm^3$ to $1.0\times10^{18}/cm^3$, although lesser and greater atomic concentrations may also be used. Optionally, portions of the substrate semiconductor layer 10 may be vertically recessed in a peripheral device region 400, and peripheral semiconductor devices 700 may be formed on a recessed surface of the substrate semiconductor layer 10. A memory array region 100 in which a three-dimensional array of memory devices is to be subsequently formed is provided outside of the peripheral device region 400. A staircase region 200 may be provided between the memory array region 100 and the peripheral device region 400. Optionally, a portion of the substrate semiconductor layer 10 may be recessed within an area of the memory array region 100, and additional peripheral semiconductor devices 700 may be formed on a recessed surface of the substrate semiconductor layer 10 in the memory array region 100. While the present disclosure is described using an embodiment, alternative configurations for the substrate 8 may be used provided that a semiconductor material layer is provided in an upper portion of the substrate 8 in the memory array region. The semiconductor material layer that provides a physically exposed semiconductor surface in the memory array region 100 may be polycrystalline or single crystalline.

An alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the substrate semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially the same throughout each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 2:
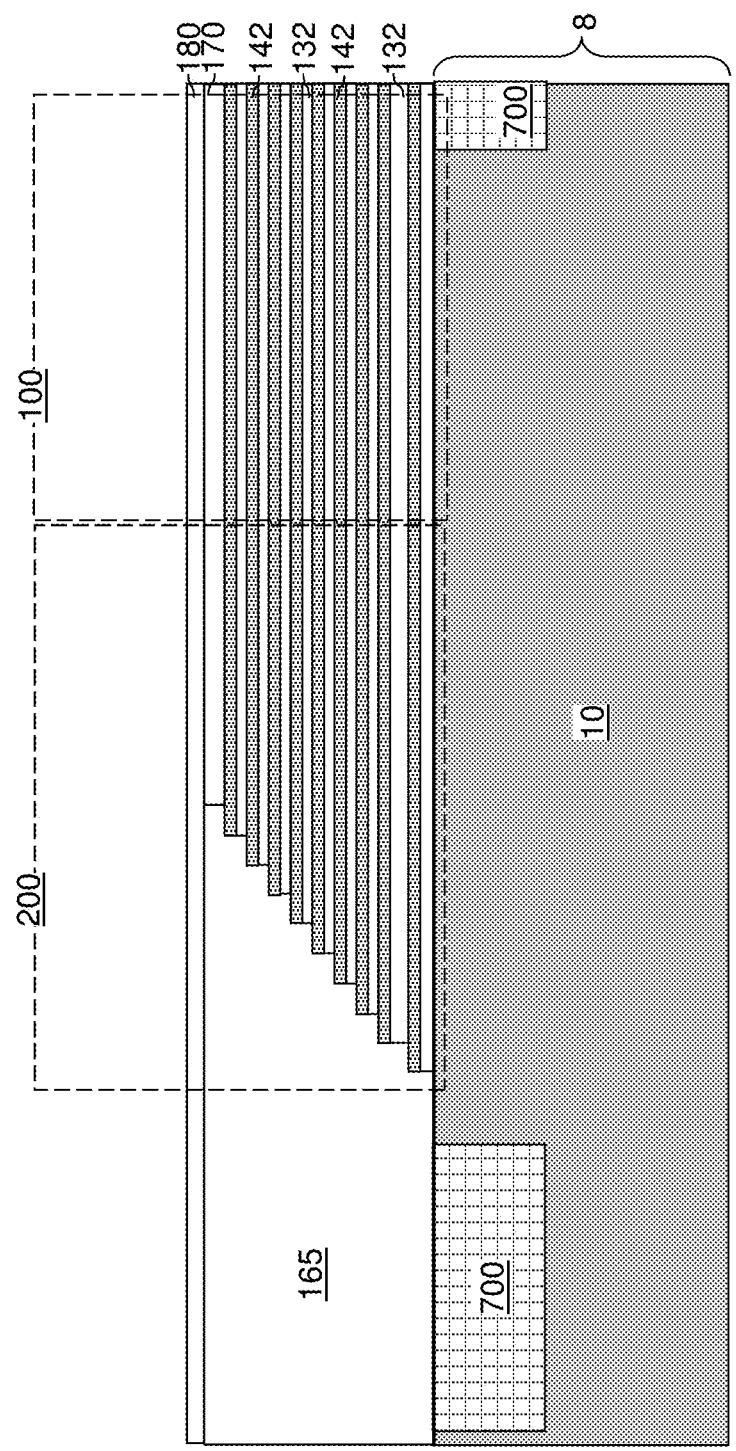
FIG. 2 is a vertical cross-sectional view of the exemplary structure after patterning a first-tier staircase region, a first retro-stepped dielectric material portion, and an inter-tier dielectric layer according to an embodiment of the present disclosure.

Referring to FIG. 2, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 3A:
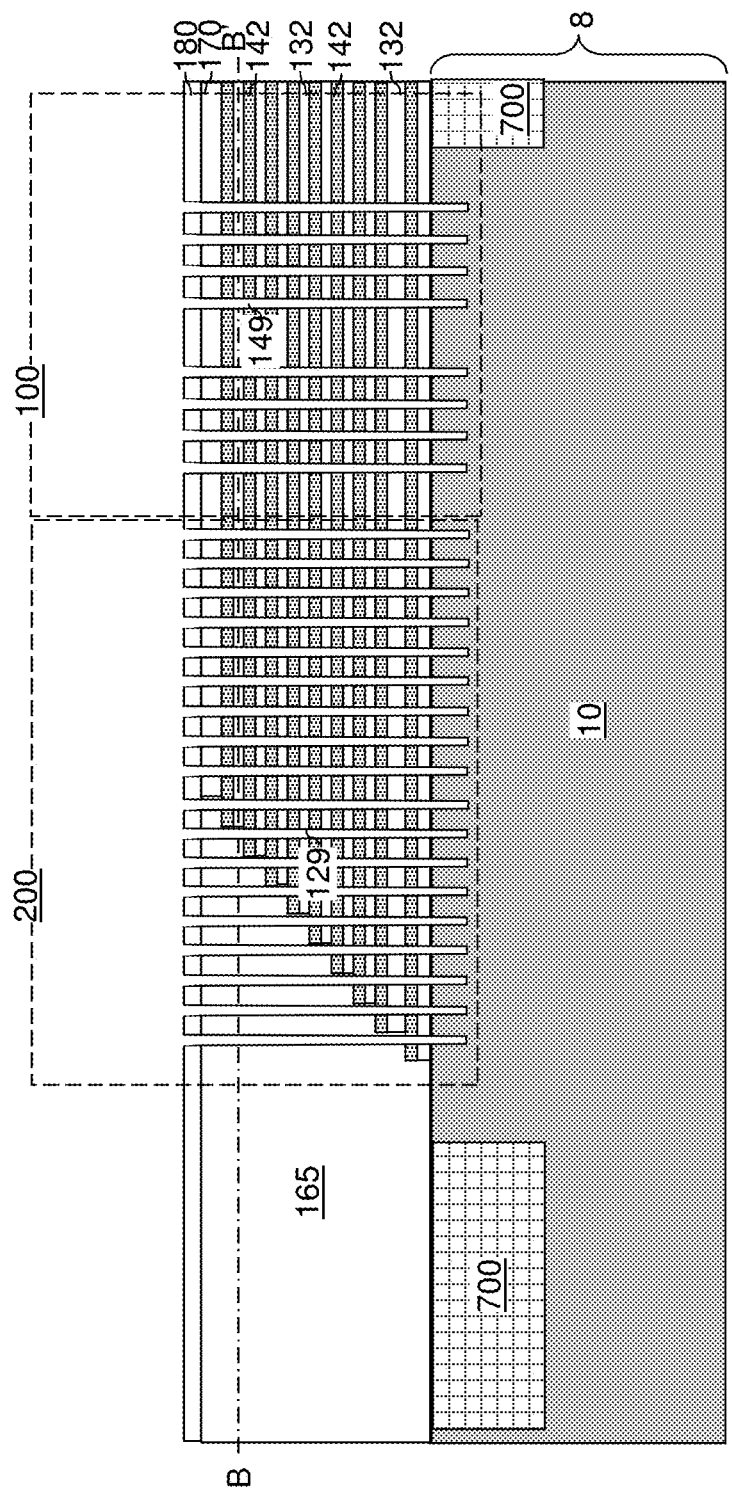
FIG. 3A is a vertical cross-sectional view of the exemplary structure after formation of first-tier memory openings and first-tier support openings according to an embodiment of the present disclosure.
Figure 3B:
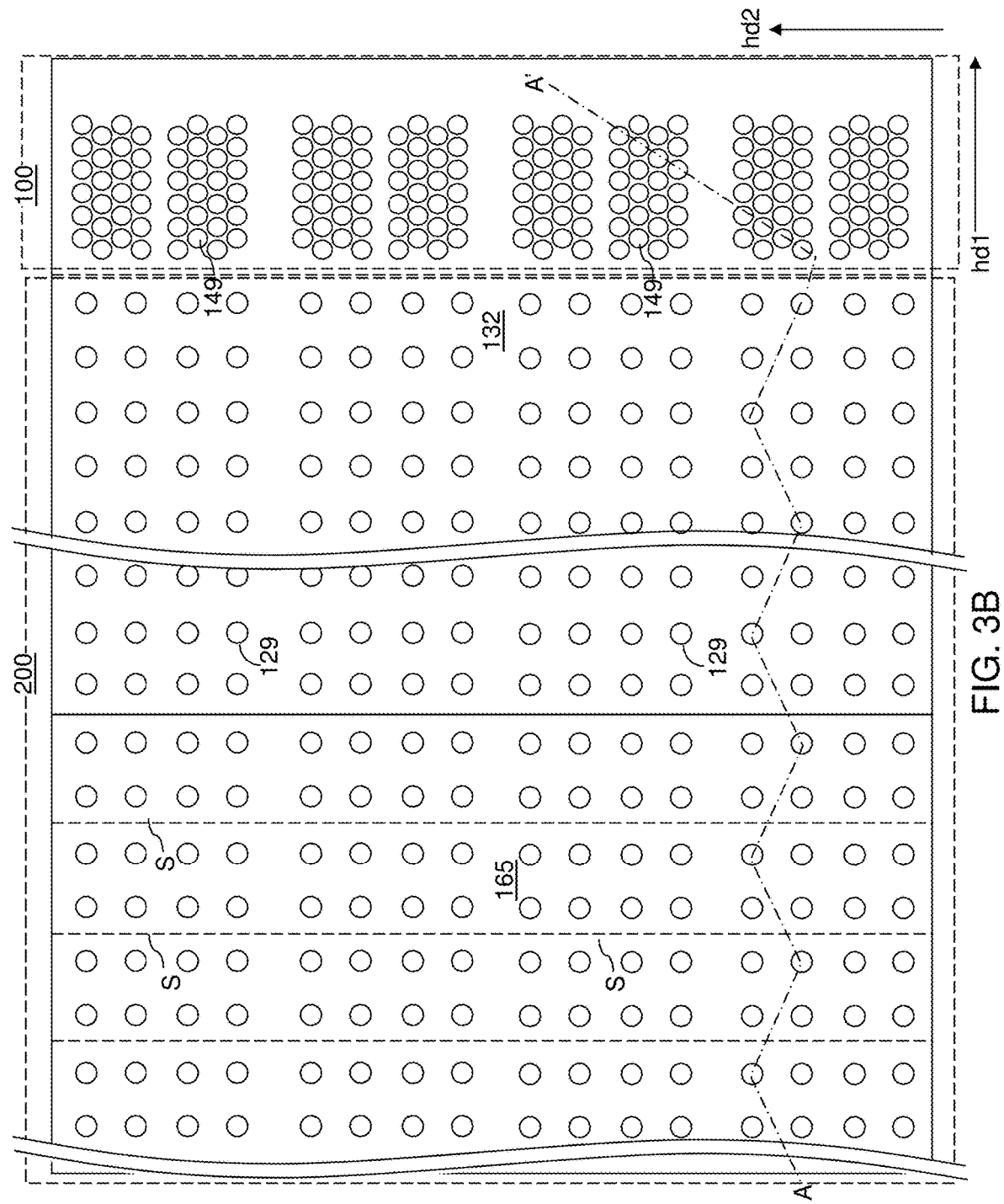
FIG. 3B is a horizontal cross-sectional view along horizontal plane B-B' of the exemplary structure of FIG. 3A. The hinged vertical plane A-A' corresponds to the plane of the vertical cross-sectional view of FIG. 3A.

Referring to FIGS. 3A and 3B, various first-tier openings (149, 129) may be formed through the inter-tier dielectric layer 180 and the first-tier structure (132, 142, 170, 165) and into the substrate semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the substrate semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered.

After etching through the first-tier alternating stack (132, 142) and the first stepped dielectric material portion 165, the chemistry of a terminal portion of the first anisotropic etch process may be selected to etch into an upper portion of the substrate semiconductor layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

The first-tier memory openings 149 are formed in the memory array region 100 in which each layer of the first-tier alternating stack (132, 142) is present, and the first-tier support openings 129 are formed in the staircase region 200. The first-tier memory openings 149 are arranged in first rows that are parallel to the first horizontal direction hd1, and the first-tier support openings 129 are arranged in second rows that are parallel to the first horizontal direction hd1.

Figure 4:
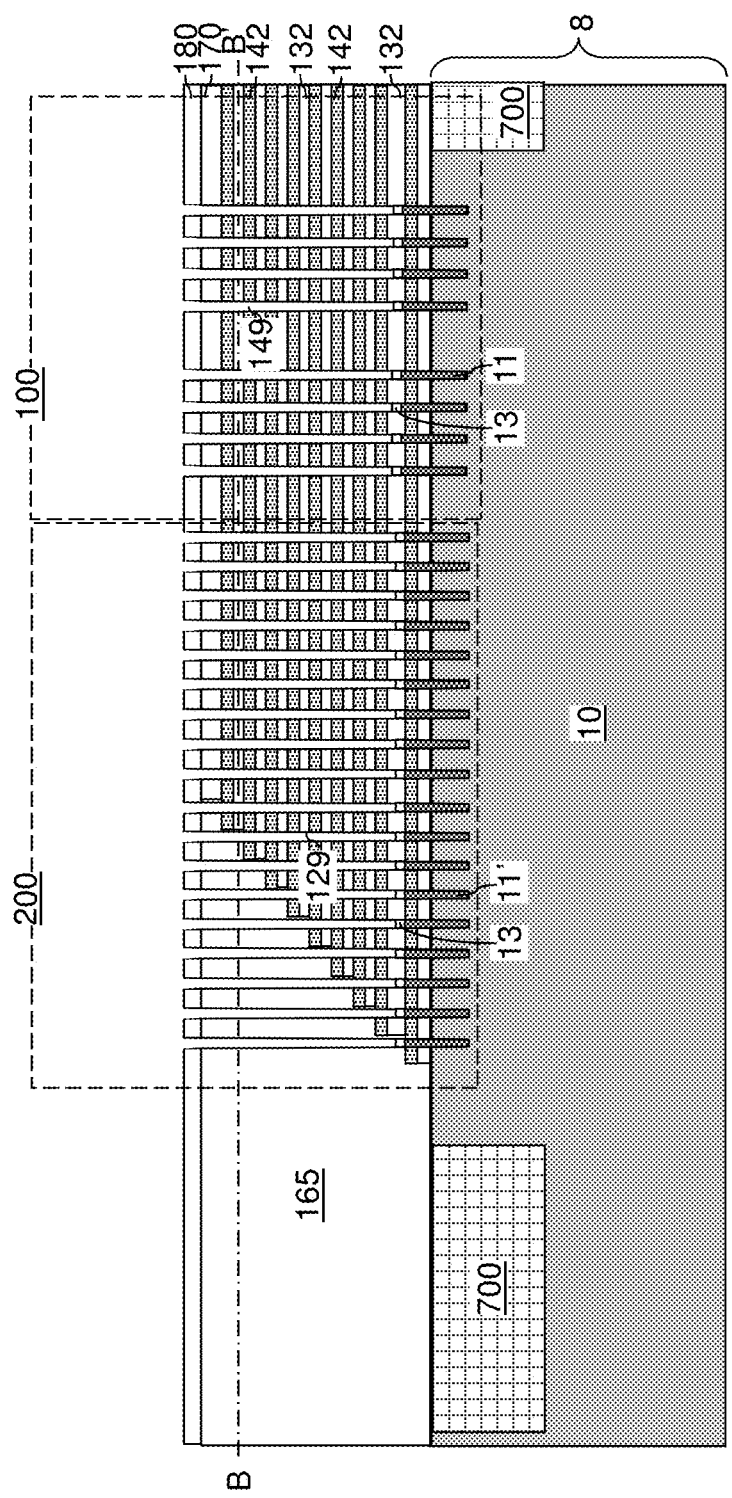
FIG. 4 is a vertical cross-sectional view of the exemplary structure after formation of pedestal channel portions, pedestal semiconductor portions, and semiconductor oxide plates according to an embodiment of the present disclosure.

Referring to FIG. 4, a selective semiconductor deposition process (such as selective epitaxy or a selective polycrystalline semiconductor deposition process) may be performed to grow a doped semiconductor material having a doping of the first conductivity type. The exemplary structure may be placed in a vacuum-tight chemical vapor deposition (CVD) chamber, and a combination of a semiconductor precursor gas (such as silane, disilane, dichlorosilane, trichlorosilane, silicon tetrachloride, germane, or a precursor gas for a compound semiconductor material), a dopant gas including atoms of electrical dopants of the first conductivity type (which may be, for example, diborane for p-type dopants or phosphine, arsine, or stibine for n-type dopants), and an etchant gas (such as hydrogen chloride) is flowed into the CVD chamber while the exemplary structure is at an elevated temperature. The elevated temperature may be in a range from 500 degrees Celsius to 900 degrees Celsius. A pedestal channel portion 11 may grow from the physically exposed semiconductor surface of the substrate semiconductor layer 10 within each first-tier memory opening 149. A pedestal semiconductor portion 11' may grow from the physically exposed semiconductor surface of the substrate semiconductor layer 10 within each first-tier support opening 129.

In one embodiment, top surfaces of the pedestal channel portions 11 and the pedestal semiconductor portions 11' may be formed above a horizontal plane including the top surface of a bottommost first sacrificial material layer 142. In this case, a source select gate electrode may be subsequently formed by replacing the bottommost first sacrificial material layer 142 with a conductive material layer. The pedestal channel portion 11 may be a portion of a transistor channel that extends between a source region to be subsequently formed in the substrate semiconductor layer 10 and a drain region to be subsequently formed at an upper end of each vertical semiconductor channel. Each pedestal semiconductor portion 11' is subsequently incorporated into a respective support pillar structure that is used to provide structural support during subsequent processing steps. In one embodiment, the pedestal channel portion 11 and the pedestal semiconductor portions 11' may have a doping of the first conductivity type, which is the same as the conductivity type of the substrate semiconductor layer 10. The pedestal channel portions 11 and the pedestal semiconductor portions 11' may include electrical dopants of the first conductivity type at an atomic concentration in a range from $1.0 \times 10^{14}/cm^3$ to $1.0 \times 10^{18}/cm^3$, although lesser and greater atomic concentrations may also be used.

An oxidation process may be performed to convert upper surface regions of the pedestal channel portions 11 and the pedestal semiconductor portions 11' into semiconductor oxide plates 13. A thermal oxidation process or a plasma oxidation process may be used to convert the upper surface regions of the pedestal channel portions 11 and the pedestal semiconductor portions 11' into the semiconductor oxide plates 13. Each semiconductor oxide plate 13 may have a vertical thickness in a range from 3 nm to 10 nm, such as from 4 nm to 8 nm, although lesser and greater thicknesses may also be used. The semiconductor oxide plates 13 may be formed within each of the first-tier memory openings 149 and each of the first-tier support openings 129, and may contact sidewalls of the first insulating layer 132 that contacts a top surface of the bottommost one of the first sacrificial material layers 142. In other words, the semiconductor oxide plates 13 may contact sidewalls of a second bottommost one of the first insulating layers 132. In one embodiment, the semiconductor oxide plates 13 may consist essentially of silicon oxide.

Figure 5:
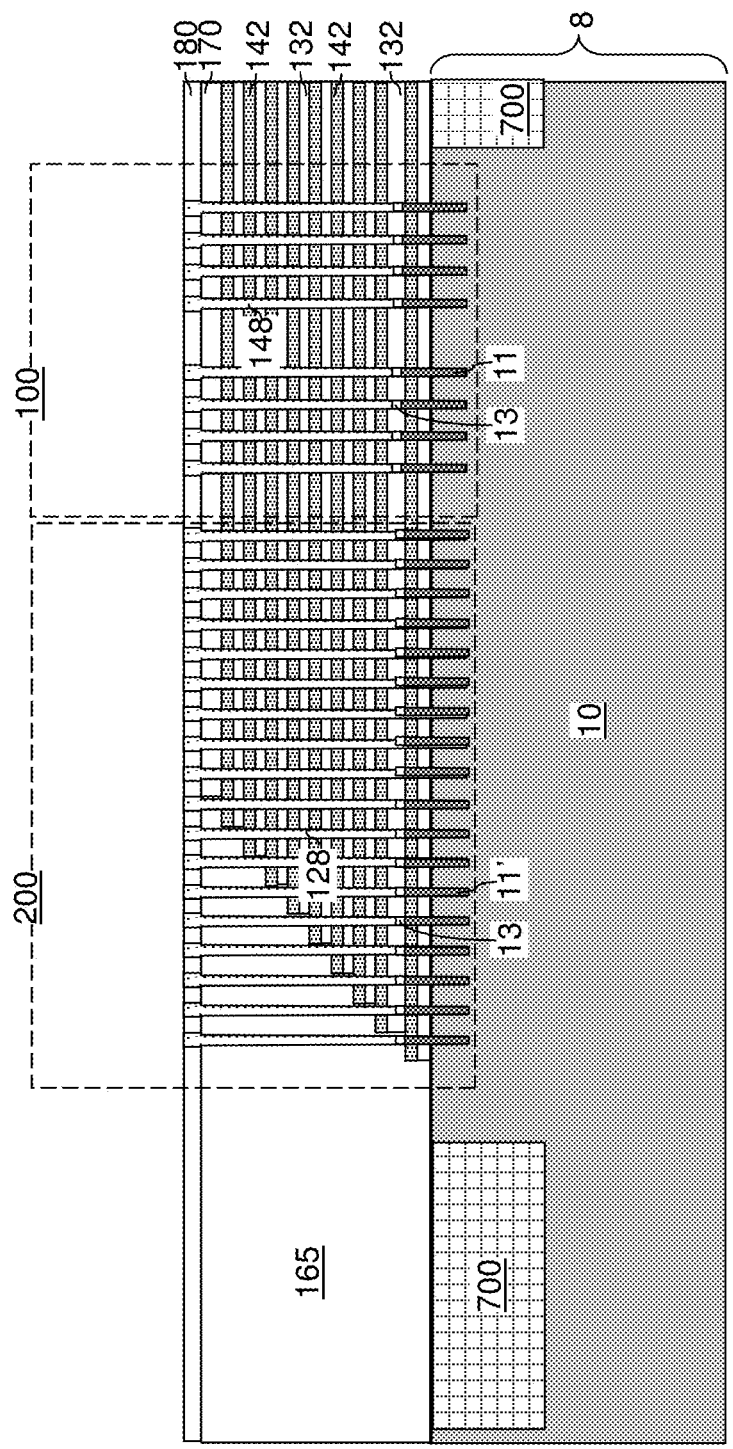
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129) directly on, and over, the semiconductor oxide plates 13. For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142. A subset of the semiconductor oxide plates 13 provided in the staircase region 200 may be used as etch stop structures in a subsequent etch process.

In one embodiment, the sacrificial first-tier fill material may include a semiconductor material such as silicon (e.g., a-Si or polysilicon), a silicon-germanium alloy, germanium, a III-V compound semiconductor material, or a combination thereof. In one embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
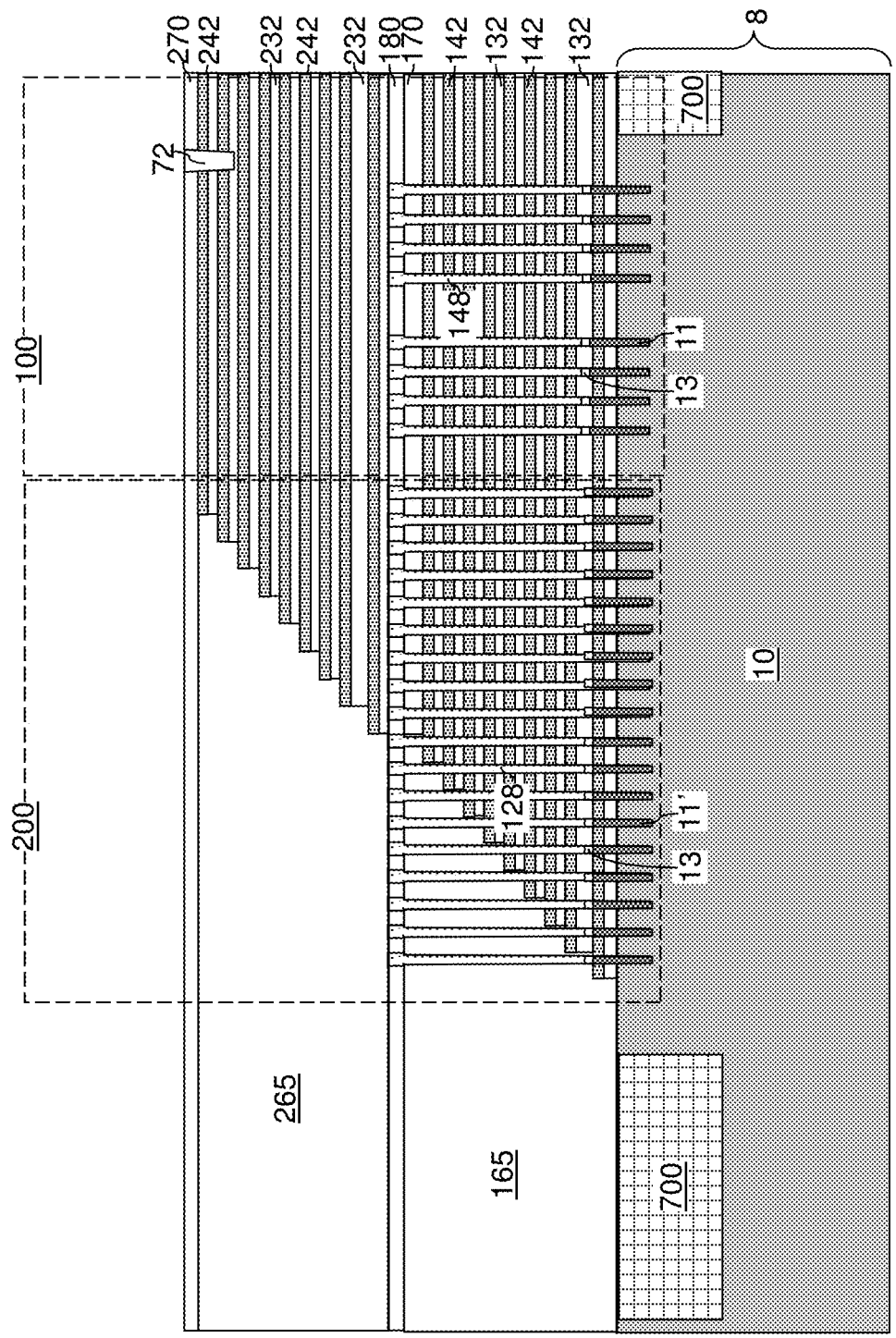
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

In general, at least one alternating stack of insulating layers (132, 232) and spacer material layers (such as sacrificial material layers (142, 242)) may be formed over the substrate semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
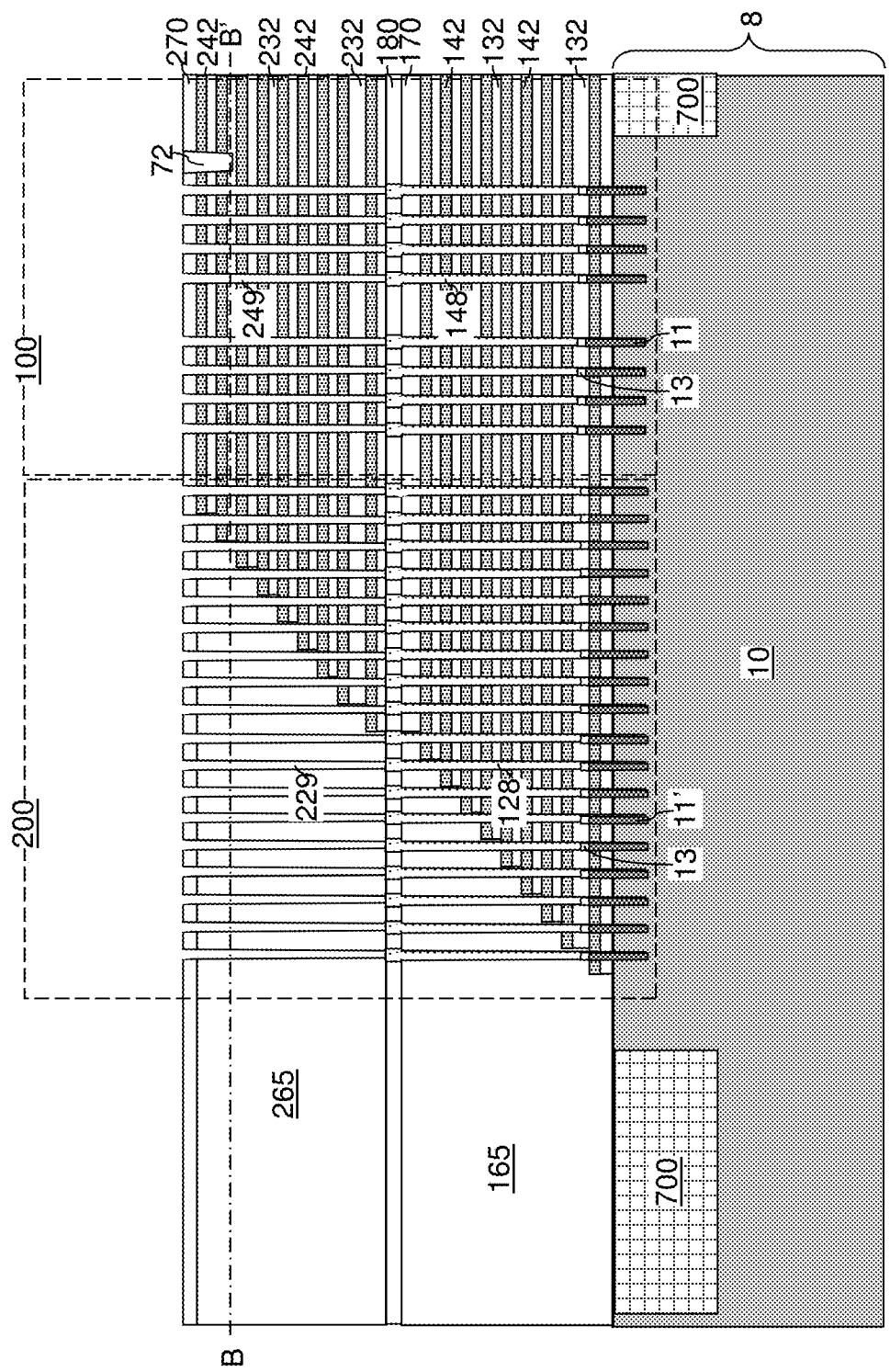
FIG. 7A is a vertical cross-sectional view of the exemplary structure after formation of second-tier memory openings and second-tier support openings according to an embodiment of the present disclosure.
Figure 7B:
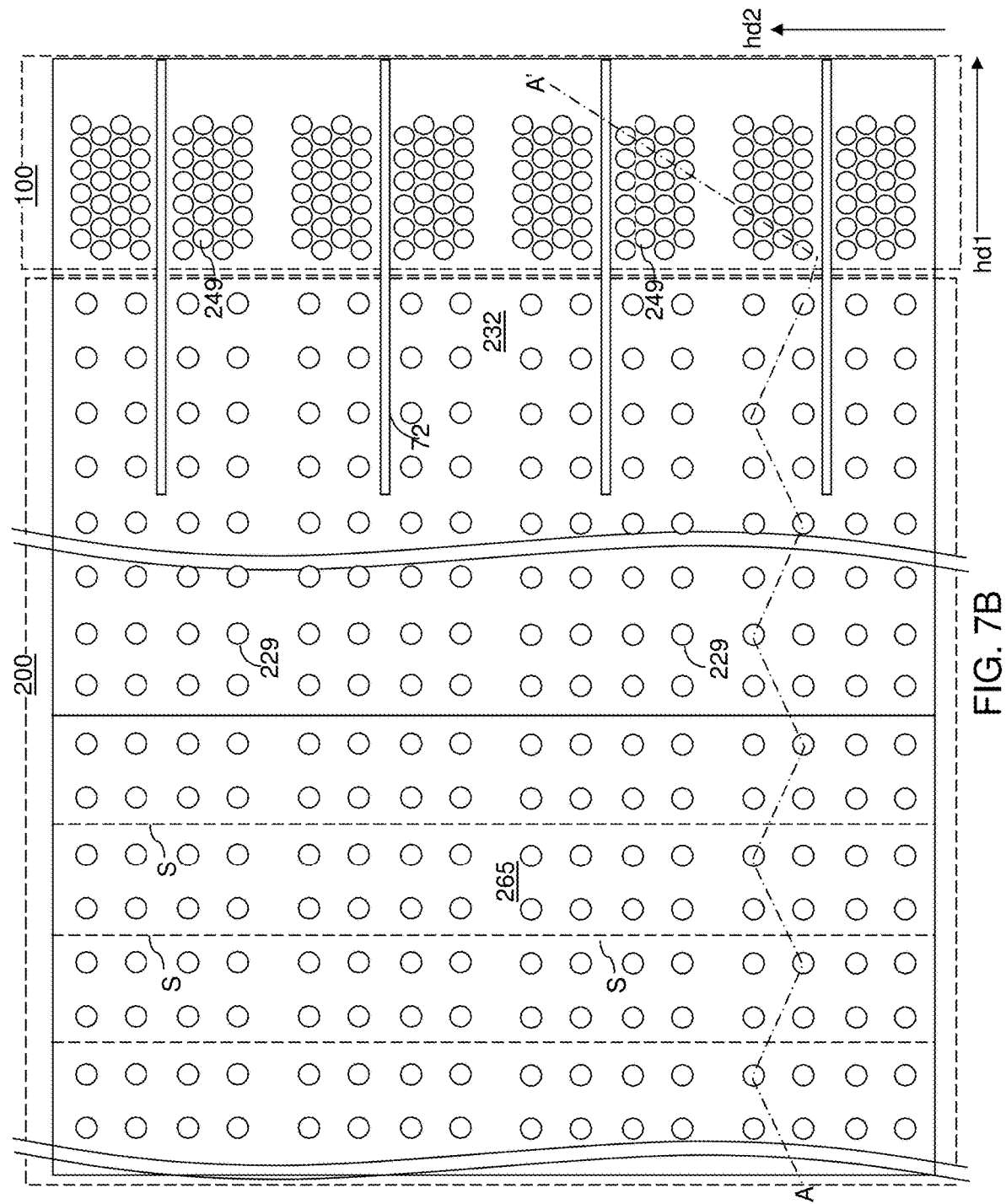
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second-tier alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
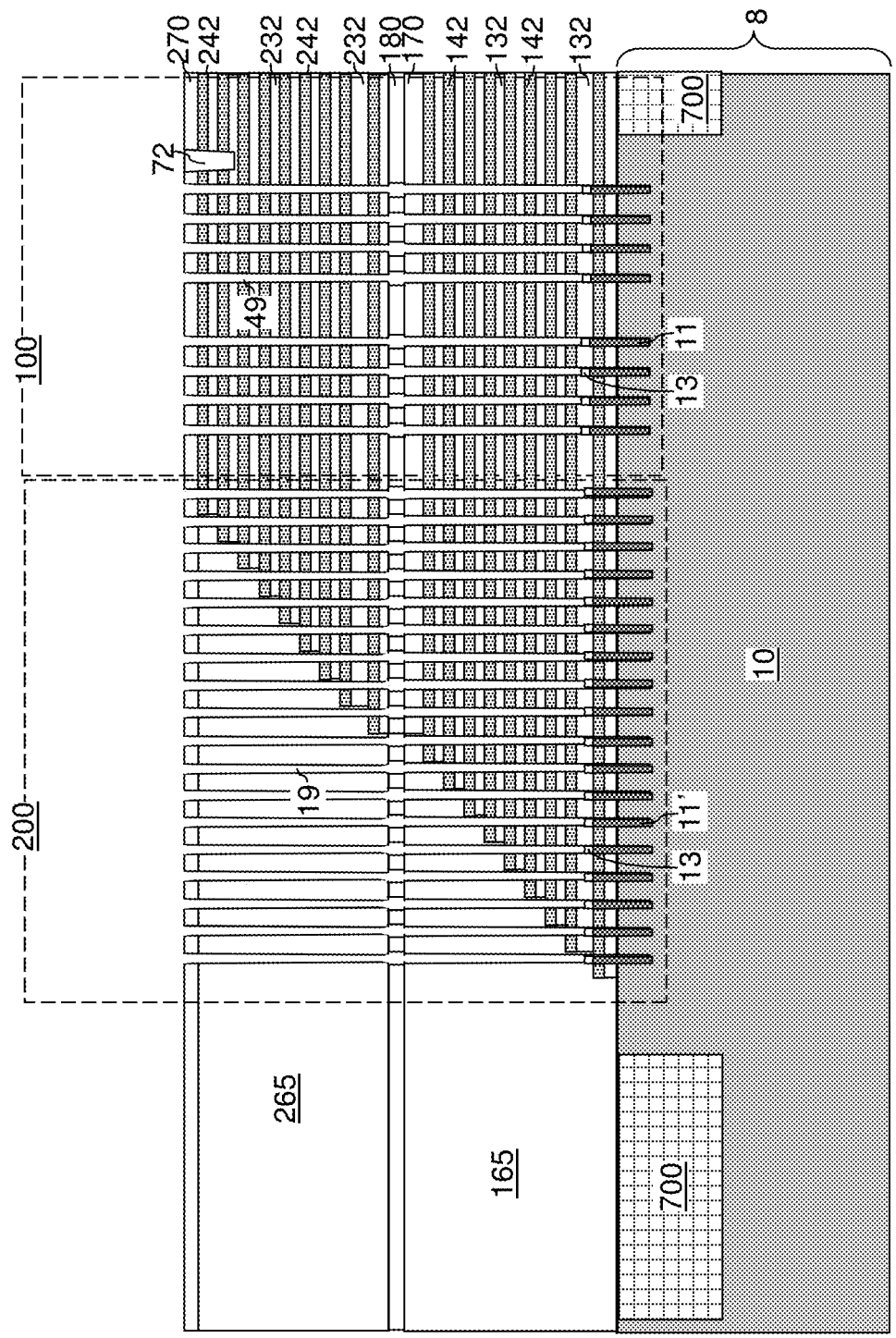
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), the inter-tier dielectric layer 180, and the semiconductor oxide plates 13. In an illustrative example, if the sacrificial first-tier opening fill portions (148, 128) include amorphous silicon, the sacrificial first-tier opening fill portions (148, 128) may be removed by a wet etch process using hot trimethyl-2 hydroxyethyl ammonium hydroxide ("hot TMY") or tetramethyl ammonium hydroxide (TMAH).

Each vertical stack of a volume of a first-tier memory opening 149 and a second-tier memory opening 249 constitutes a memory opening 49, which is also referred to as an inter-tier memory opening 49. A bottom portion of each memory opening 49 is filled within a pedestal channel portion 11 and a semiconductor oxide plate 13. Each vertical stack of a volume of a first-tier support opening 129 and a second-tier support opening 229 constitutes a support opening 19, which is also referred to as an inter-tier support opening 19. A bottom portion of each support opening 19 is filled within a pedestal semiconductor portion 11' and a semiconductor oxide plate 13.

Figure 9A:
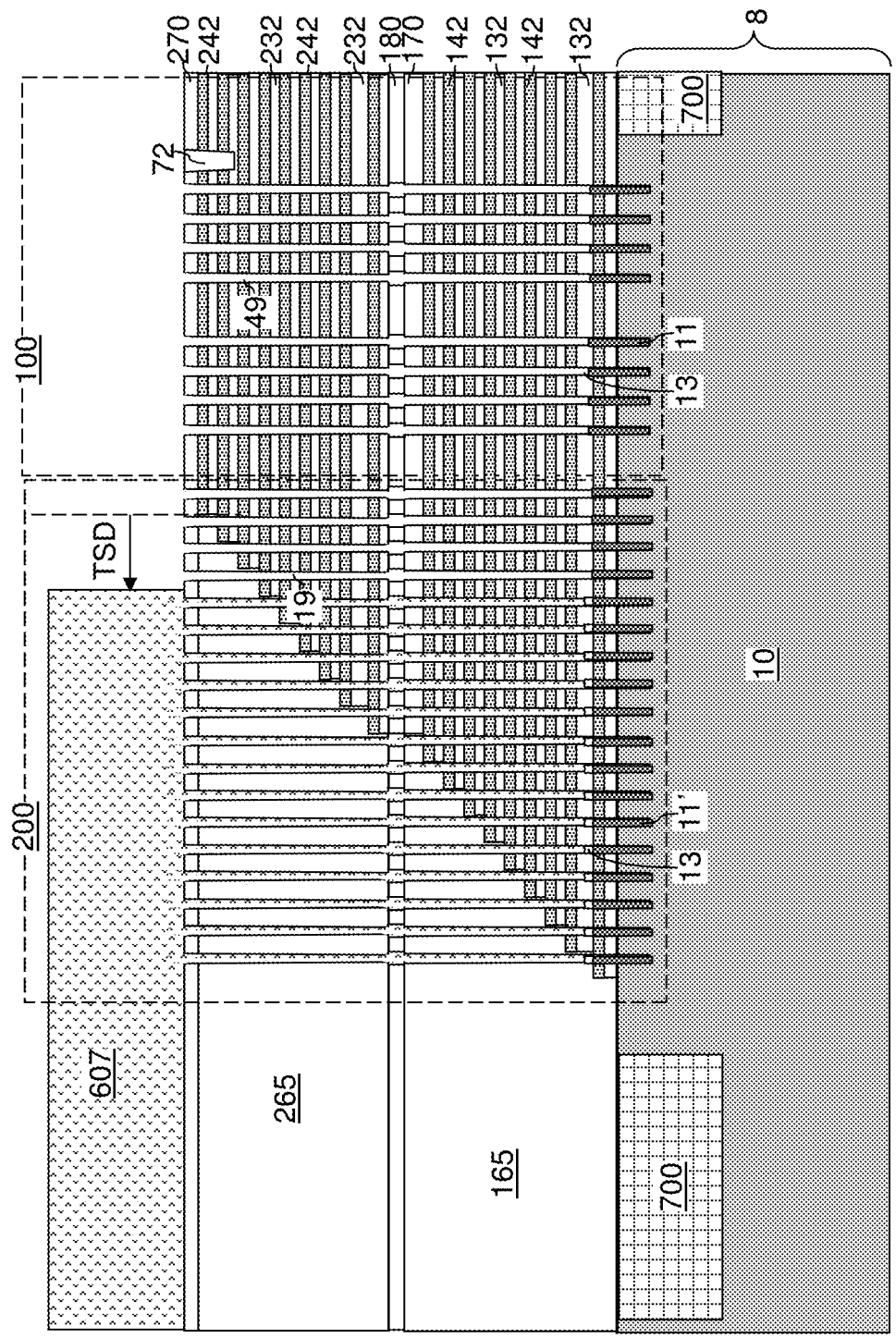
FIG. 9A is a vertical cross-sectional view of the exemplary structure after formation of a patterned mask layer according to an embodiment of the present disclosure.

Referring to FIG. 9A, a patterned mask layer 607 may be formed over the exemplary structure. The patterned mask layer 607 may include a lithographically patterned photoresist layer, which may be formed as a blanket photoresist material layer and is subsequently lithographically patterned to cover, and fill a first subset of the support openings 19 without covering a second subset of the support openings 19 or the memory openings 49. Specifically, a distal segment of the staircase region 200 including the first subset of the support openings 19 is covered with the patterned mask layer 607. As shown in FIG. 9A, the lithographic patterning process may pattern the blanket photoresist material layer such that the patterned mask layer 607 may be formed with a straight edge that is laterally spaced from an interface between the retro-stepped dielectric material portion 265 and a topmost layer within the alternating stack of the first and second insulating layers 232 and the first and second sacrificial material layers 242 by the threshold separation distance TSD. In alternative embodiments, the patterned mask layer 607 may be formed with a straight edge that is laterally spaced from an interface between the retro-stepped dielectric material portion 165 and a topmost layer within the alternating stack of the first and second insulating layers 132 and the first and second sacrificial material layers 142 by the threshold separation distance TSD. The distal segment of the staircase region 200 including the first subset of the support openings 19 is located further from the interface between the retro-stepped dielectric material portion 165, 265 and the topmost layer within the alternating stack {(132, 142), (232, 242)} than the edge of the patterned mask layer 607 is from the interface. A proximal segment of the staircase region 200 including the second subset of the support openings 19 that is not covered by the patterned mask layer 607 is located closer to the interface between the retro-stepped dielectric material portion 165, 265 and the topmost layer within the alternating stack {(132, 242), (232, 242)} than the edge of the patterned mask layer 607 is to the interface. The first subset of the support openings 19 is herein referred to as a distal subset of the support openings 19, and the second subset of the support openings 19 is herein referred to as a proximal subset of the support openings 19. The semiconductor oxide plates 13 located in the memory openings or in the proximal subset of the support openings 19 are not masked by the patterned mask layer 607, and the distal subset of the support openings is masked by the patterned mask layer 607.

The semiconductor oxide plates 13 that are not masked by the patterned mask layer 607 are removed selective to a material of the pedestal semiconductor portions 11 and the pedestal channel portions 11' while the patterned mask layer 607 is present. An etch process is performed to etch the semiconductor oxide plates 13 that are not masked by the patterned mask layer 607 from underneath the memory openings 49 and the proximal subset of the support openings 19. The etch process may be selective to the material of the pedestal channel portions 11. The etch process may include an anisotropic etch process or an isotropic etch process. The semiconductor oxide plates 13 that are located in the memory openings 49 or in the proximal subset of the support openings 19 (which is laterally spaced from the memory array region 100 by less than the threshold separation distance TSD) without removing semiconductor oxide plates 13 that are located in the distal subset of the support openings 19 (that is laterally spaced from the memory array region 100 by a distance greater than the threshold separation distance TSD).

Figure 10:
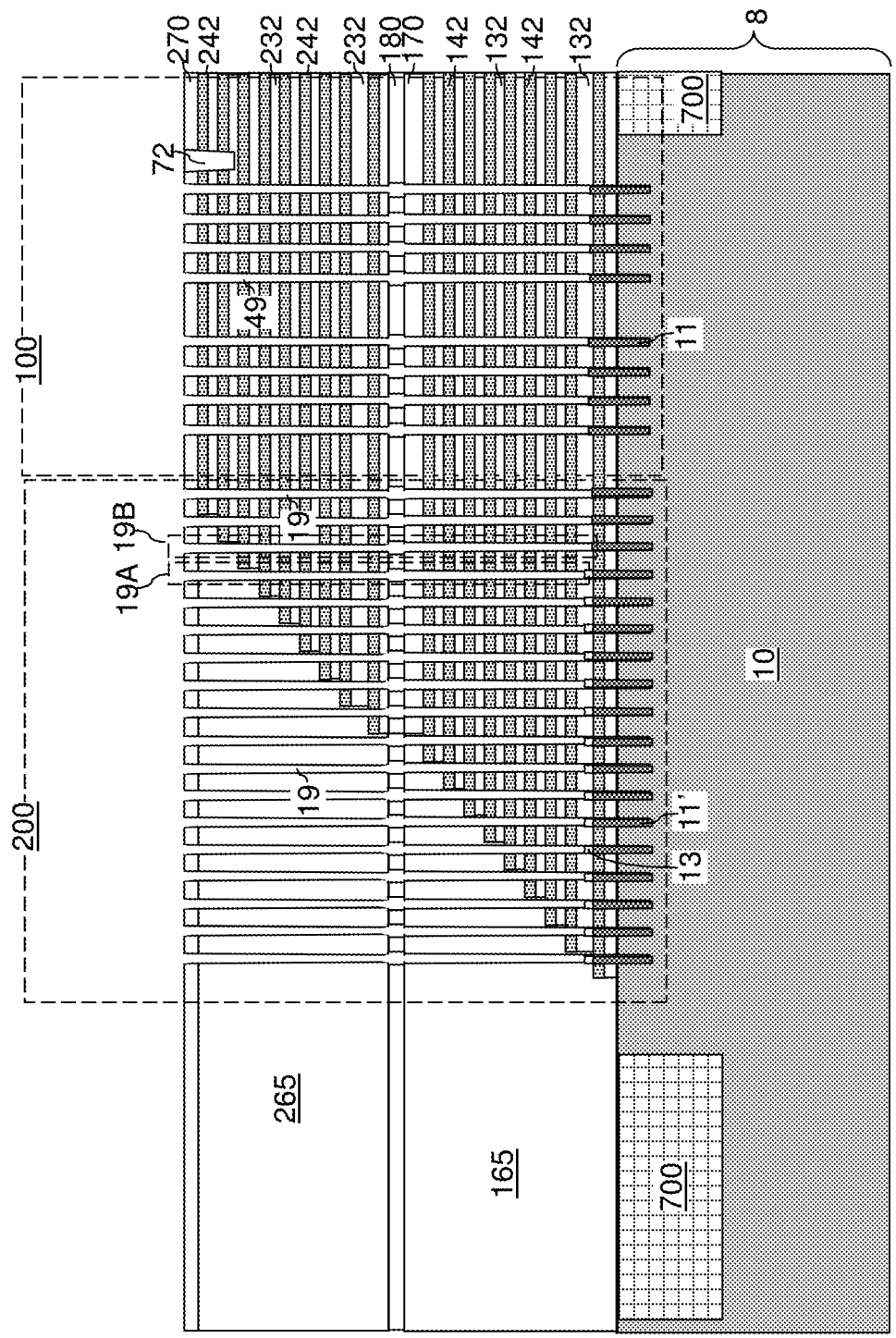
FIG. 10 is a vertical cross-sectional view of the exemplary structure after removal of the patterned mask layer according to an embodiment of the present disclosure.

Referring to FIG. 10, the patterned mask layer 607 may be removed, for example, by ashing. The support openings 19 include first support openings 19A and second support openings 19B. Specifically, a distal subset of the support openings 19 include first support openings 19A that are laterally spaced from the memory array region 100 by a distance greater than a threshold separation distance TSD, and a proximal subset of the support openings 19 include second support openings 19B that are laterally spaced from the memory array region 100 by a distance less than the threshold separation distance TSD. The pedestal semiconductor portions 11' and the semiconductor oxide plates 13 are used as components of support pillar structures.

Subsequently, additional components of support pillar structures are formed within each of the support openings 19'. FIGS. 11A-11D are sequential vertical cross-sectional views of a first support opening 19A during formation of a first support pillar structure 20A (illustrated in FIG. 11D). FIGS. 12A-12D are sequential vertical cross-sectional view of a second support opening 19B during formation of a second support pillar structure 20B (illustrated in FIG. 12D).

Figure 12A:
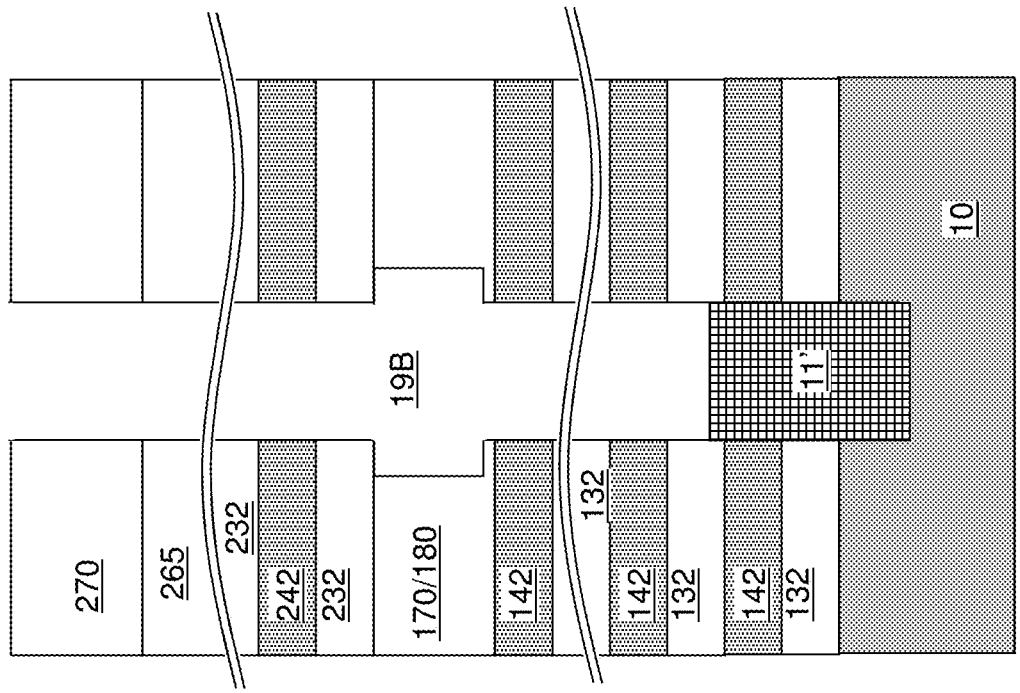
Figure 11A:
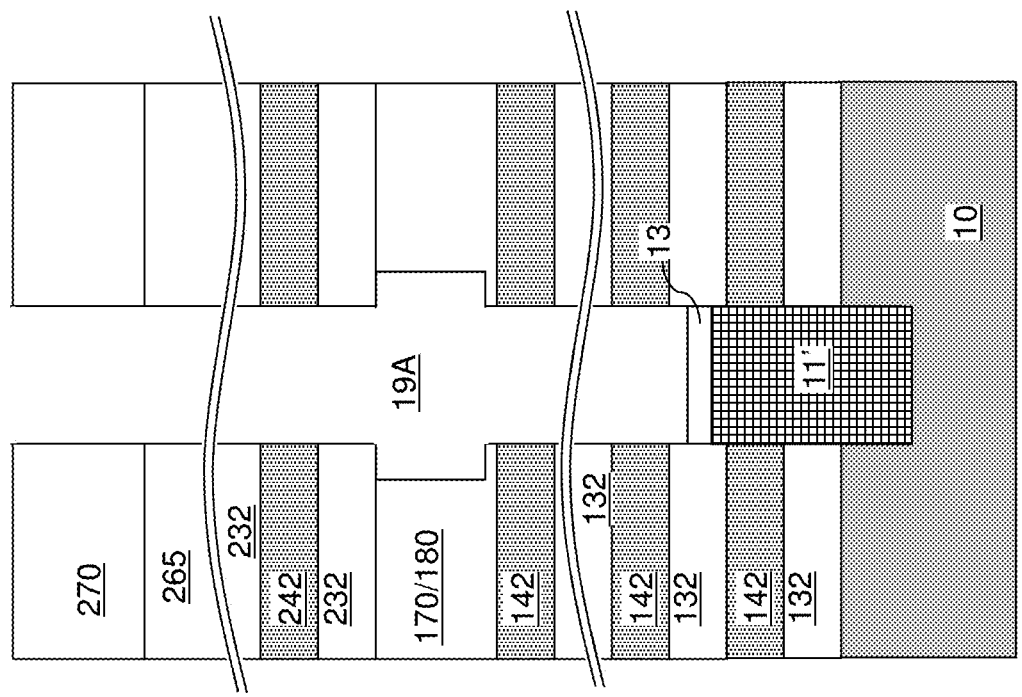

Referring to FIGS. 11A and 12A, a first support opening 19A and a second support opening 19B are illustrated at the processing steps of FIG. 10.

Figures 11B, 12B:
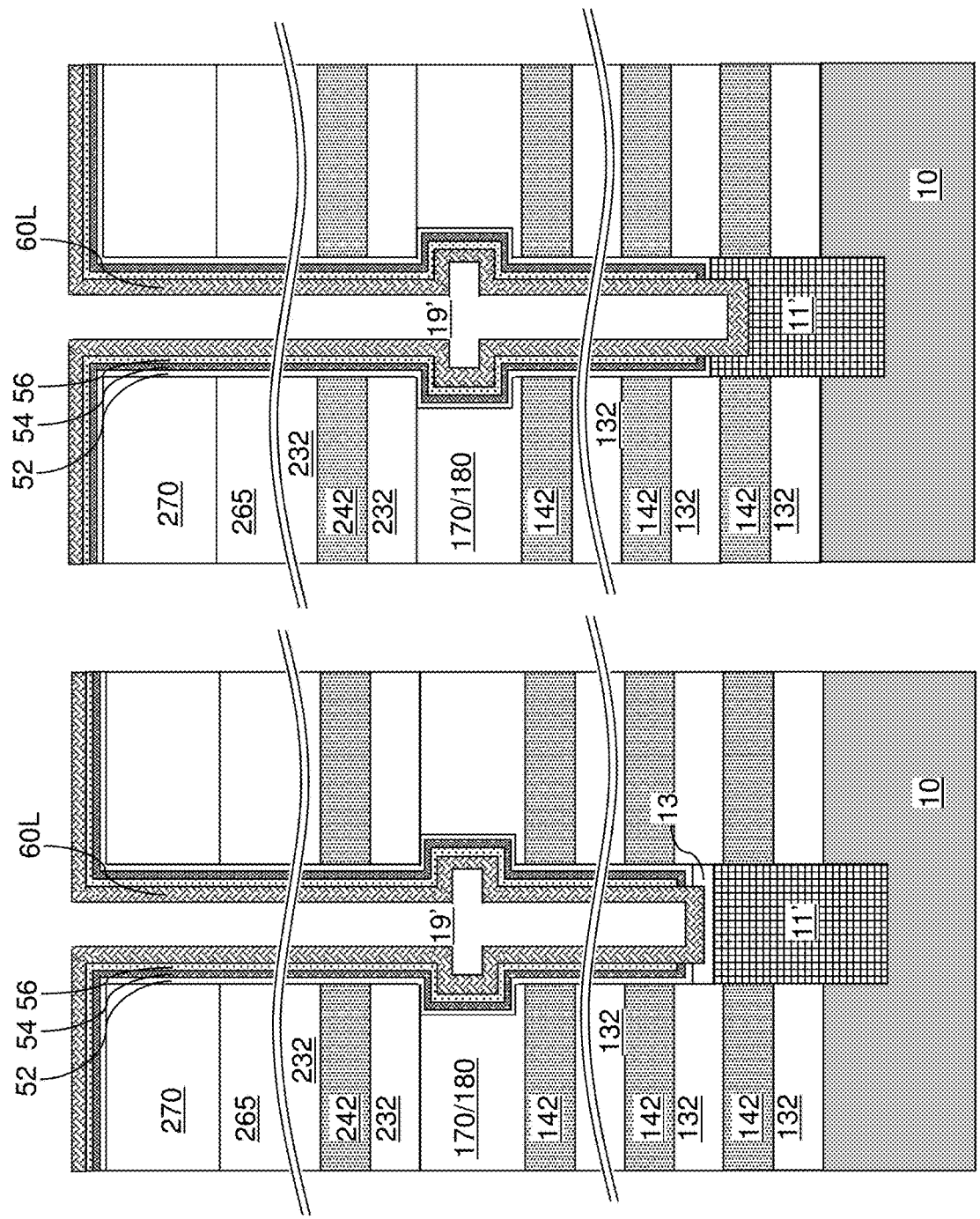
Figure 12C:
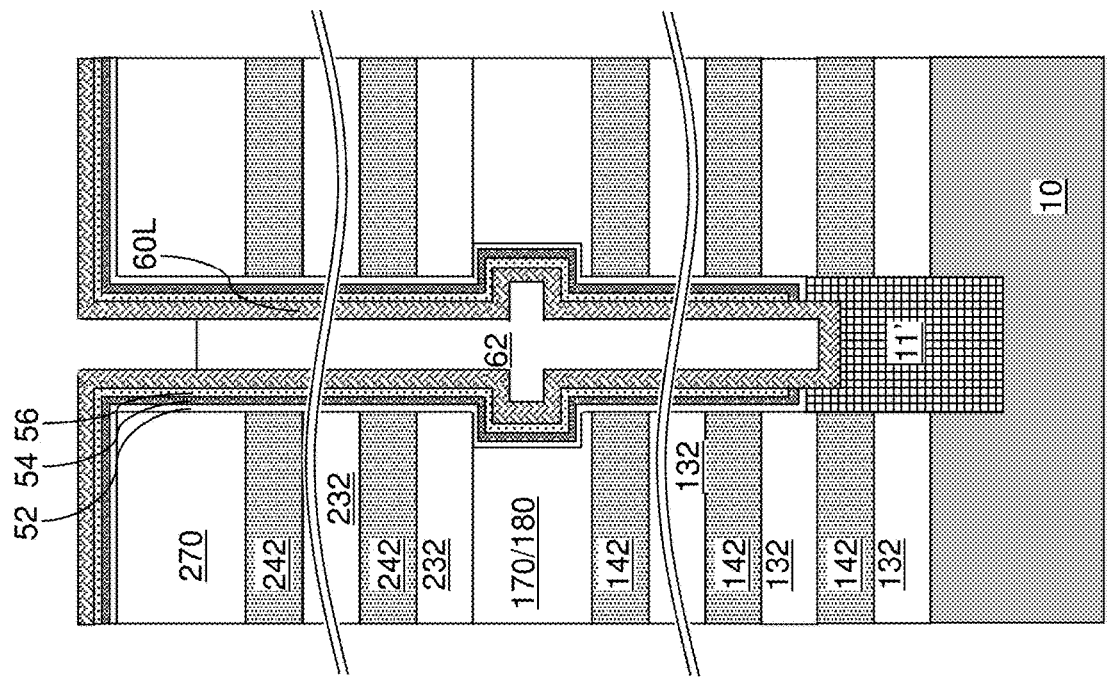

Referring to FIGS. 11B and 12B, a stack of layers including a blocking dielectric layer 52, a charge storage layer 54, a tunneling dielectric layer 56, and a semiconductor channel material layer 60L may be sequentially deposited in each of the support openings 19' (19A, 19B) and in each of the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 19' is formed in each volume of the support openings (19A, 19B) and the memory openings 49 that is not filled with the deposited material layers (52, 54, 56, 60L).

Figure 11C:
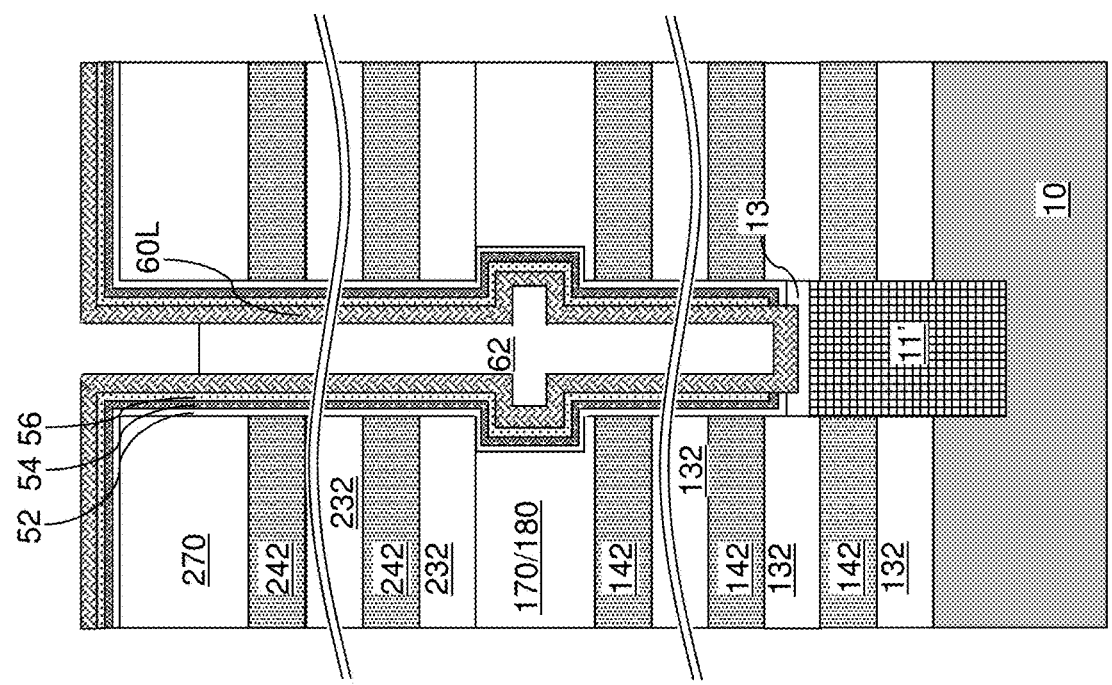

Referring to FIGS. 11C and 11D, a dielectric core layer may be deposited in the cavities 19'. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 13:
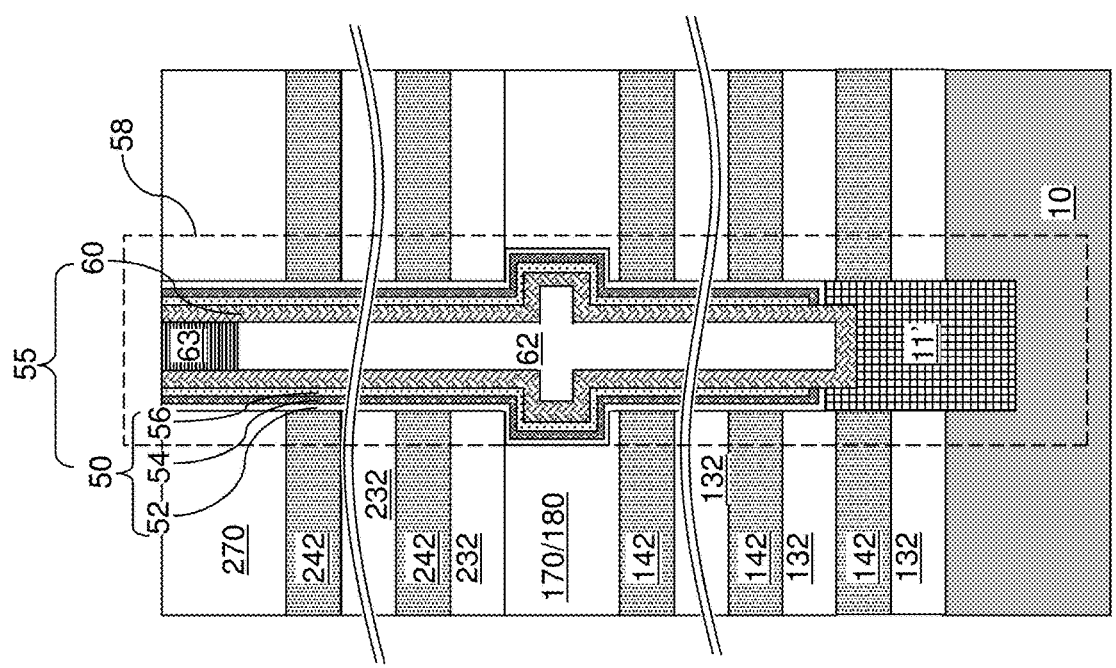
FIG. 13 is a vertical cross-sectional view of a memory opening fill structure at the processing steps of FIGS. 11D and 12D according to an embodiment of the present disclosure.
Figure 14:
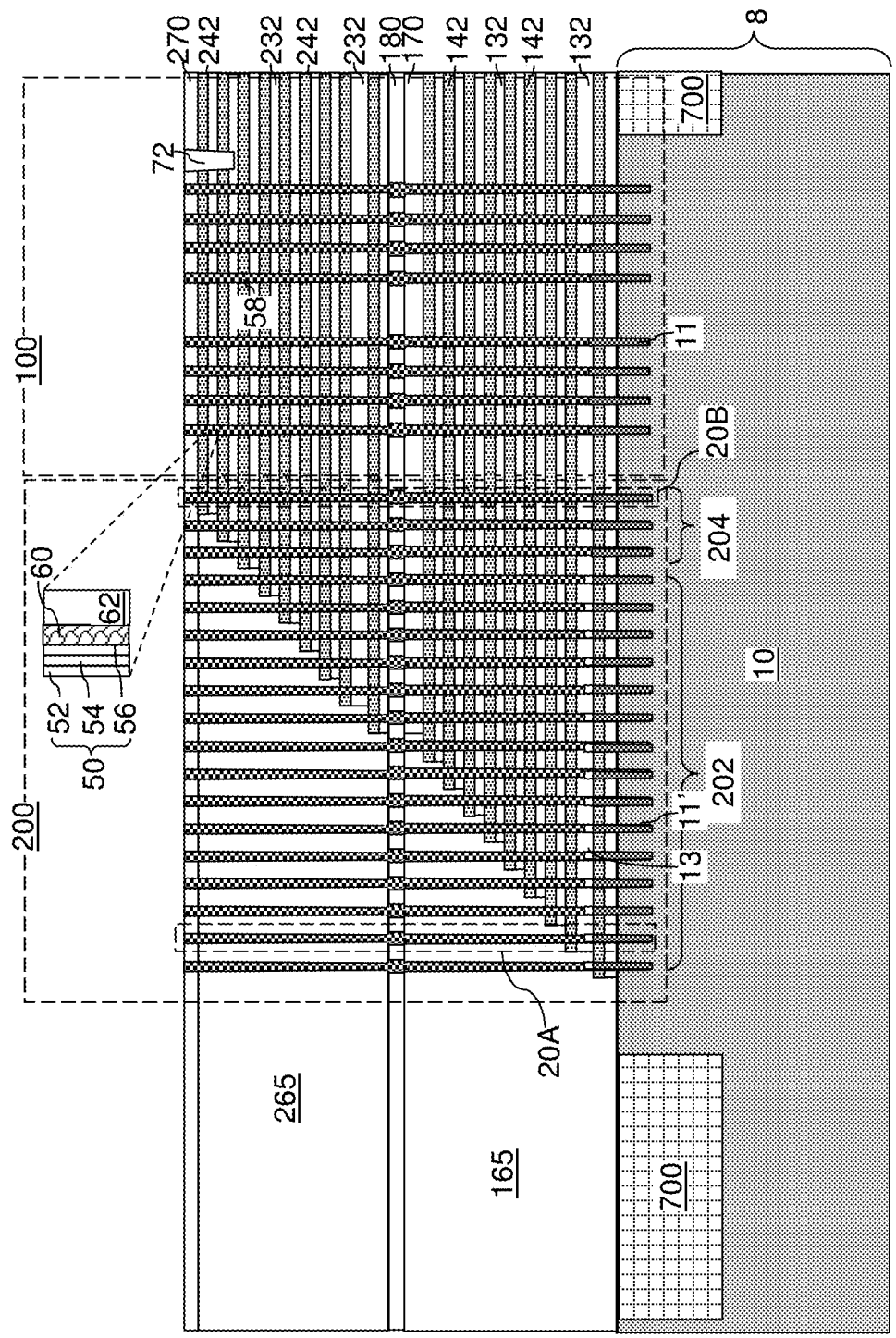
FIG. 14 is a vertical cross-sectional view of the exemplary structure after formation of memory opening fill structures and support pillar structures according to an embodiment of the present disclosure.

Referring to FIGS. 11D, 12D, 13, and 14, a doped semiconductor material may be deposited in recessed volumes overlying the dielectric cores 62. The doped semiconductor material is planarized to form a drain region 63 over each dielectric core 62. FIG. 11D illustrates a region around a first support opening 19A, FIG. 12D illustrates a region around a second support opening 19B, and FIG. 13 illustrates a region around a memory opening 49 after formation the drain regions 63. FIG. 14 is a vertical cross-sectional view of the exemplary structure after formation of memory opening fill structures 58 and the first and second support pillar structures 20 (20A, 20B) according to an embodiment of the present disclosure.

Specifically, the doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L within a memory opening 49 constitutes a vertical semiconductor channel 60 through which electrical current may flow when a vertical NAND device including the vertical semiconductor channel 60 is turned on. A tunneling dielectric layer 56 within a memory opening 49 is surrounded by a charge storage layer 54, and laterally surrounds a vertical semiconductor channel 60. Each adjoining set of a blocking dielectric layer 52, a charge storage layer 54, and a tunneling dielectric layer 56 within a memory opening 49 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each remaining portion of the semiconductor channel material layer 60L within a support opening 19 constitutes a vertically-extending semiconductor material portion 60'. A tunneling dielectric layer 56 within support openings 19 is surrounded by a charge storage layer 54, and laterally surrounds a vertically-extending semiconductor material portion 60'. Each adjoining set of a blocking dielectric layer 52, a charge storage layer 54, and a tunneling dielectric layer 56 within a first support opening 19A or within a second support opening 19B collectively constitute a dielectric layer stack 50', which may have the same component layers as a memory film 50.

Each combination of a pedestal semiconductor portion 11', a semiconductor oxide plate 13, a dielectric layer stack 50', a vertically-extending semiconductor material portion 60', a dielectric core 62, and a drain region 63 in the distal section of the staircase region 200 constitutes a first support pillar structure 20A, which fills a respective first support opening 19A. Each combination of a pedestal semiconductor portion 11', a dielectric layer stack 50', a vertically-extending semiconductor material portion 60', a dielectric core 62, and a drain region 63 in the distal section of the staircase region 200 constitutes a second support pillar structure 20B, which fills a respective second support opening 19B. The first support pillar structures 20A are formed in the first support openings 19A which are a distal subset of the support openings 19. The second support pillar structures 20B are formed in the second support openings 19B which are the proximal subset of the support openings 19.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52.

Each combination of a pedestal channel portion 11, a memory film 50, a dielectric core 62, and a drain region 63 constitutes a memory opening fill structure 58 that fills a respective memory opening 49. Thus, each of the memory opening fill structures 58 comprises a respective pedestal channel portion 11 and a respective memory stack structure 55. Each memory stack structure 55 comprises a memory film 50 and a vertical semiconductor channel 60. Each of the memory films 50 comprises a charge storage layer 54 and a tunneling dielectric layer 56.

Each of the first support pillar structures 20A and the second support pillar structures 20B comprises a respective pedestal semiconductor portion 11' and a respective dielectric layer stack 50' overlying the respective pedestal semiconductor portion 11'. Each pedestal semiconductor portion 11' of the first support pillar structures 20A is vertically spaced from an overlying one of the dielectric layer stacks 50' by a respective semiconductor oxide plate 13. Each pedestal semiconductor portion 11' of the second support pillar structures 20B directly contacts a bottom surface of an overlying one of the dielectric layer stacks 50'. Each of the dielectric layer stacks 50' of the first support pillar structures 20A and the second support pillar structures 20B comprises a material layer (i.e., a charge storage layer 54 of a dielectric layer stack 50') having a same composition and a same thickness as the charge storage layer 54 (of a memory film 50), and another material layer (i.e., a tunneling dielectric layer 56 of the dielectric layer stack 50') having a same composition and a same thickness as the tunneling dielectric layer (of a memory film 50). The first-tier structure (132, 142, 170, 165), the second-tier structure (232, 242, 270, 265, 72), the inter-tier dielectric layer 180, the first support pillar structures 20A, the second support pillar structures 20B, and the memory opening fill structures 58 collectively constitute a memory-level assembly. The staircase region 200 includes a distal section 202 that includes the first support pillar structures 20A and a proximal section 204 that includes the first support pillar structures 20B.

Figure 15A:
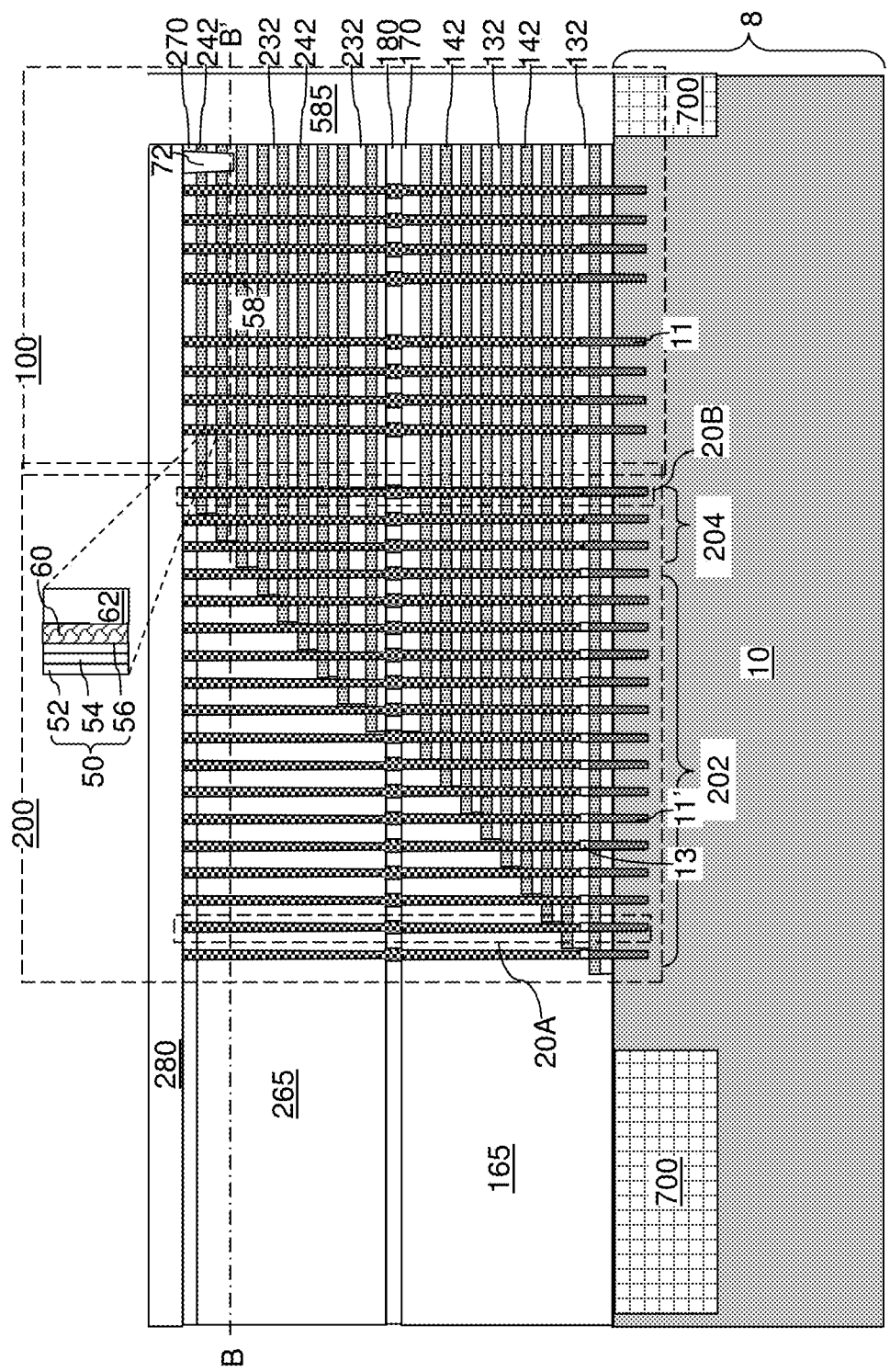
FIG. 15A is a vertical cross-sectional view of the exemplary structure after formation of pillar cavities according to an embodiment of the present disclosure.
Figure 15B:
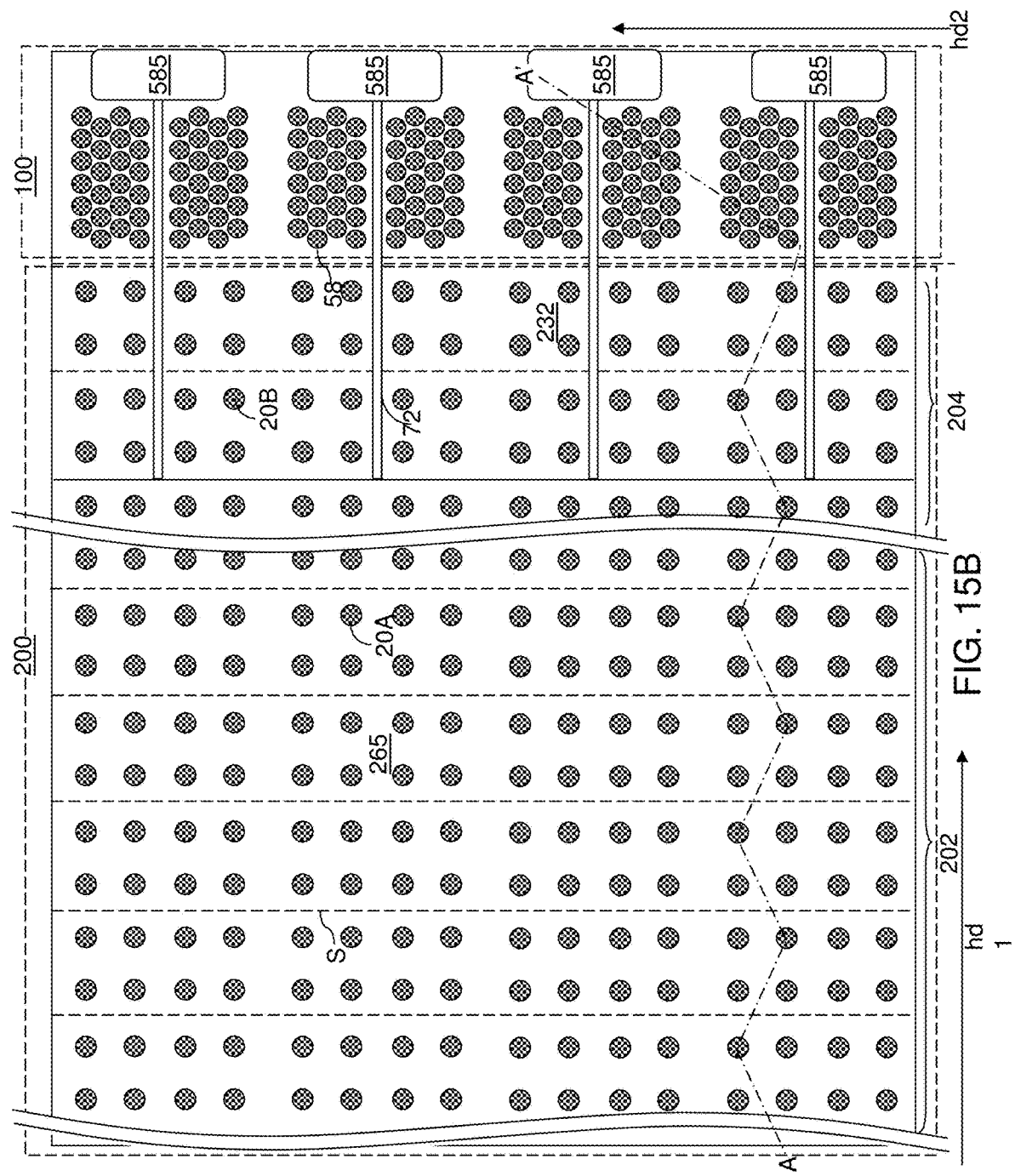
FIG. 15B is a horizontal cross-sectional of the exemplary structure along the horizontal plane B-B' of FIG. 15A. The hinged vertical plane A-A' corresponds to the plane of the vertical cross-sectional view of FIG. 15A.

Referring to FIGS. 15A and 15B, a first contact-level dielectric layer 280 may be formed over the second-tier structure (232, 242, 270, 265, 72). The first contact-level dielectric layer 280 includes a dielectric material such as silicon oxide, and may be formed by a conformal or nonconformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An optional anisotropic etch may be performed to form an optional vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of the substrate semiconductor layer 10 or top surfaces of the additional peripheral semiconductor devices 700 may be physically exposed at the bottom of each vertical interconnection region cavity 585. The photoresist layer may be removed, for example, by ashing. Alternatively, if there are no additional peripheral semiconductor devices 700 under the alternating stacks, then vertical interconnection region cavities 585 may be omitted.

Figure 16:
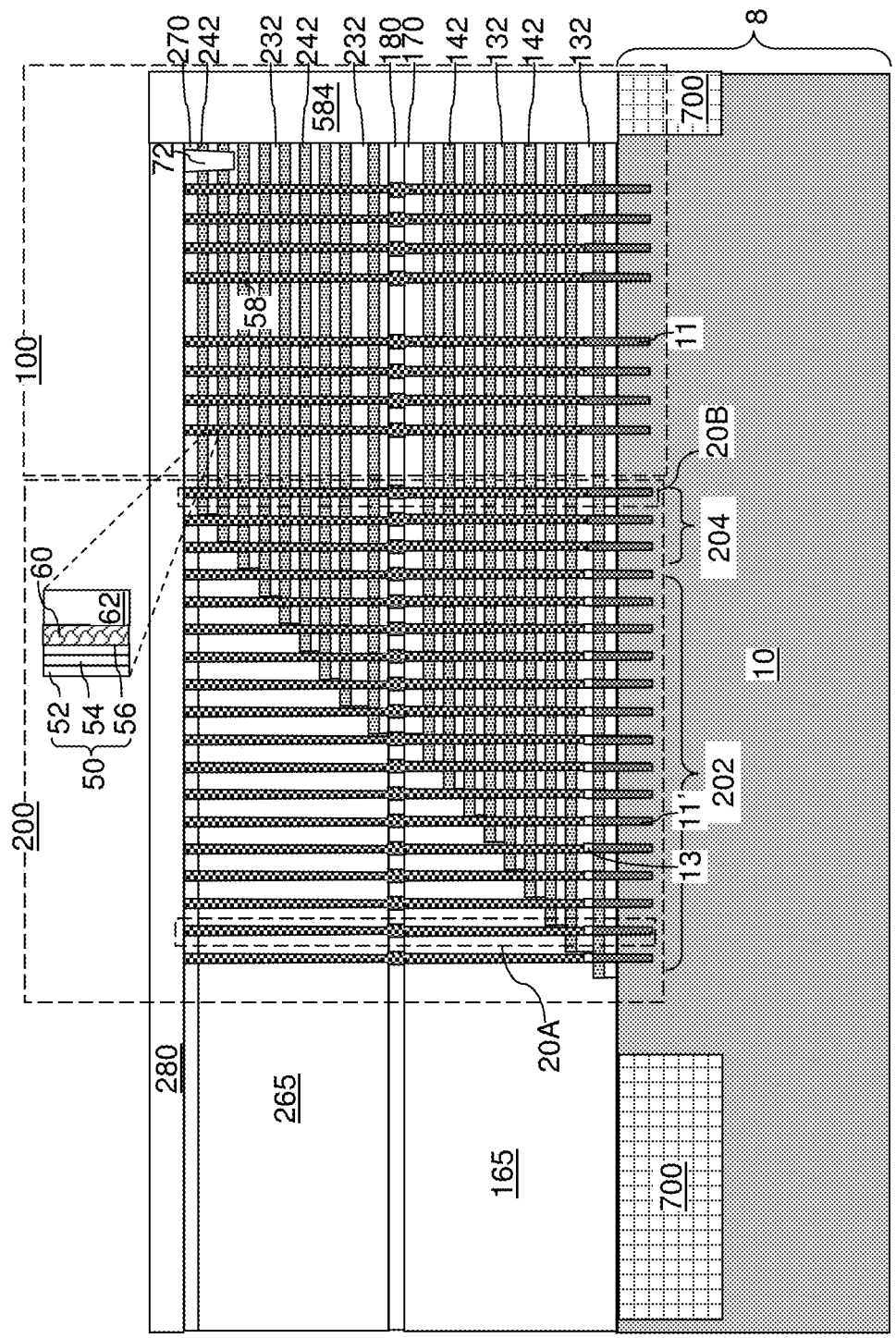
FIG. 16 is a vertical cross-sectional view of the exemplary structure after formation of dielectric pillar structures according to an embodiment of the present disclosure.

Referring to FIG. 16, if the vertical interconnection region cavities 585 are present, then an optional dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584. If the vertical interconnection region cavities 585 are omitted, then the interconnection region dielectric fill material portions 584 are also omitted.

Figure 17A:
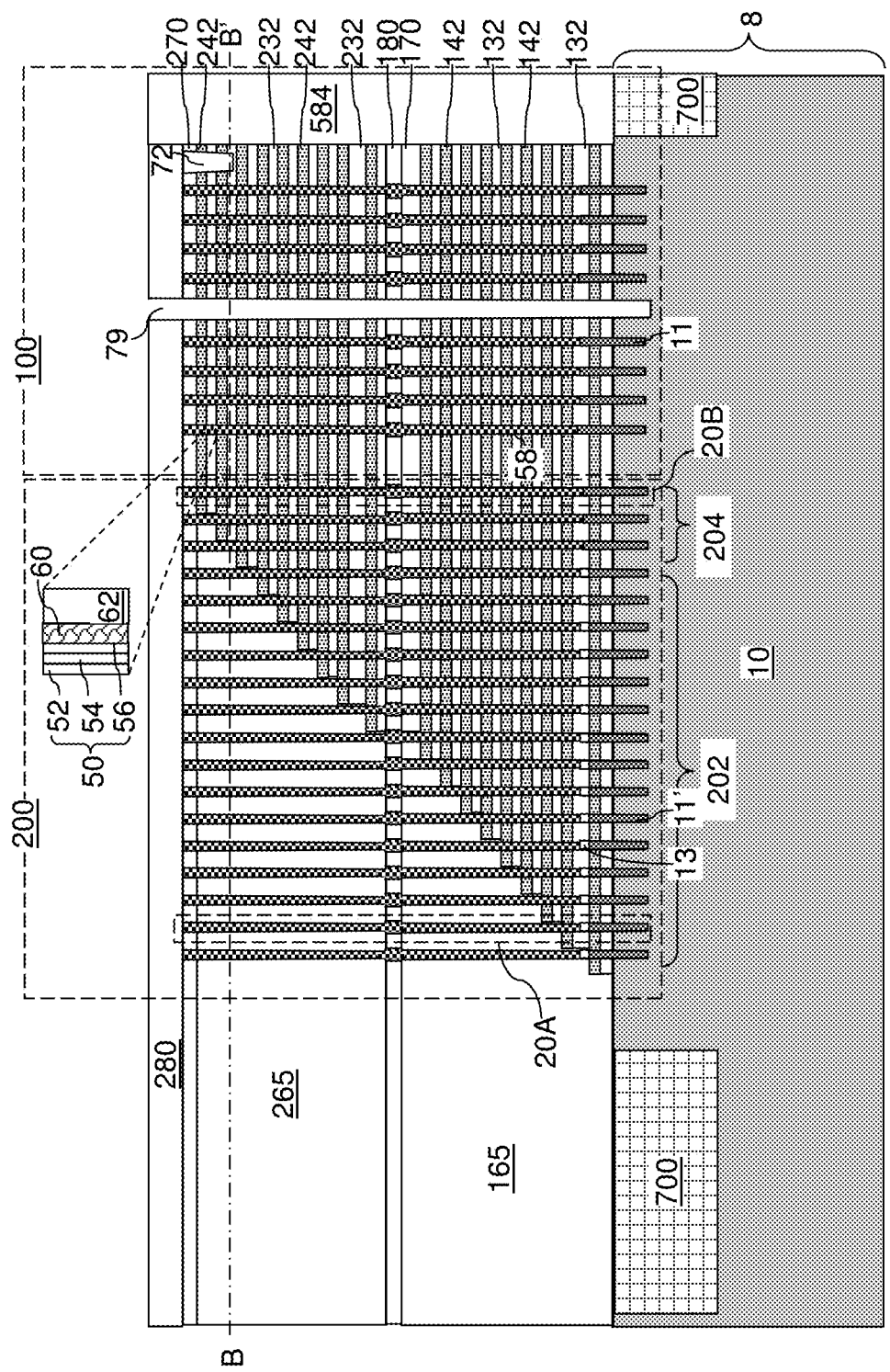
FIG. 17A is a vertical cross-sectional view of the exemplary structure after formation of a first contact-level dielectric layer and backside trenches according to an embodiment of the present disclosure.
Figure 17B:
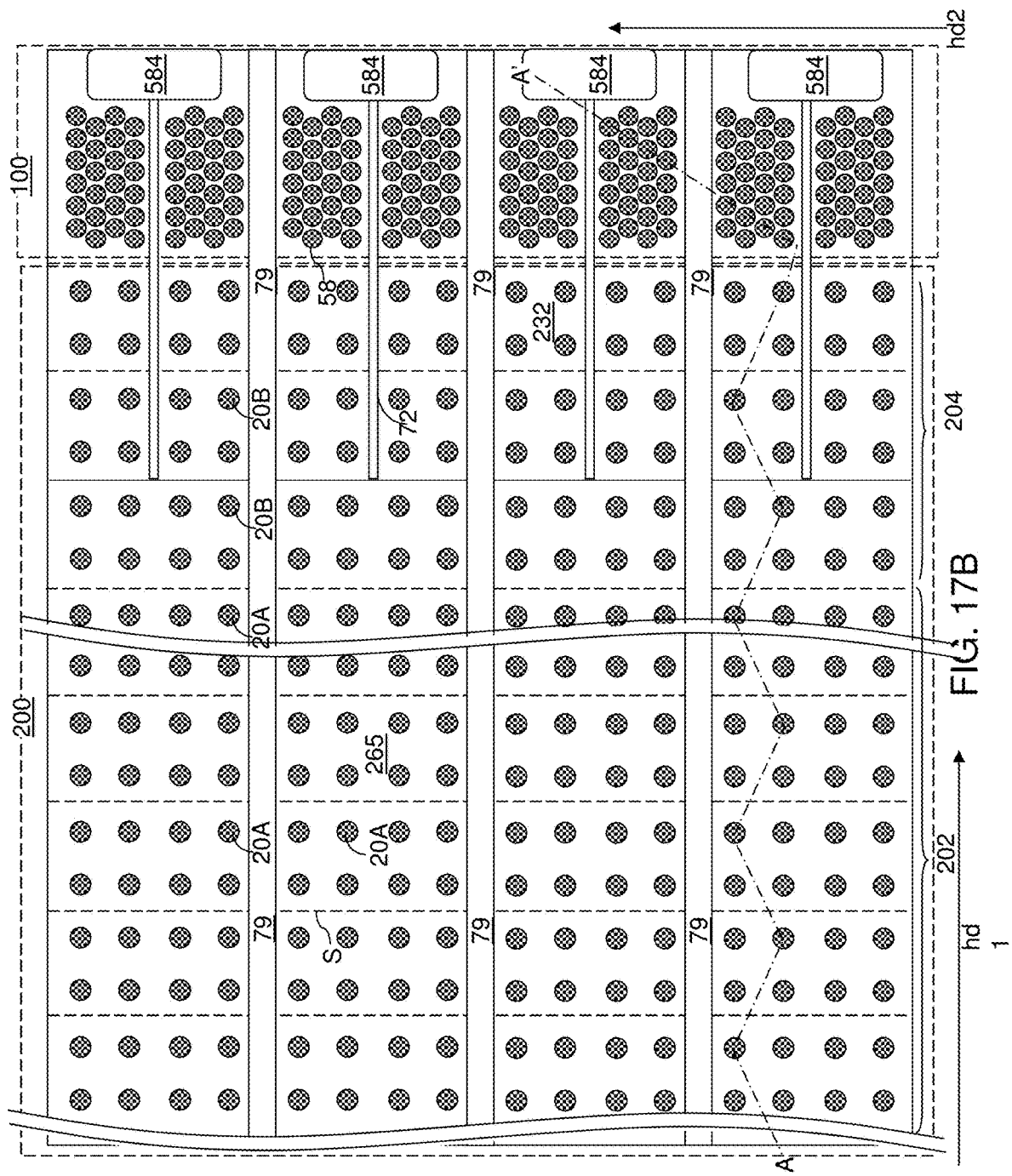
FIG. 17B is a horizontal cross-sectional of the exemplary structure along the horizontal plane B-B' of FIG. 17A. The hinged vertical plane A-A' corresponds to the plane of the vertical cross-sectional view of FIG. 17A.

Referring to FIGS. 17A and 17B, a photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the substrate semiconductor layer 10. Portions of the first contact-level dielectric layer 280, the second-tier structure (232, 242, 270, 265, 72), the first-tier structure (132, 142, 170, 165), and the substrate semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

While it is desirable for the backside trenches 79 to be formed with completely straight sidewalls, the backside trenches 79 are often formed with tilted sidewalls, local width variations, and/or curved surfaces due to local variations in electrical conductivity and accumulated charge density and due to local variations of process parameters of an anisotropic etch process used to etch through the materials of the alternating stack {(132, 142), (232, 242)} and the retro-stepped dielectric material portions (165, 265). The memory opening fill structures 58 provide local vertical conductive paths because the vertical semiconductor channels 60 directly contact underlying pedestal channel portions 11 and allows conduction of excess electrical charges in the alternating stack {(132, 142), (232, 242)} into the substrate semiconductor layer 10. According to an embodiment of the present disclosure, the second support pillar structures 20B provide additional local vertical conductive paths into the substrate semiconductor layer 10. Specifically, the vertically-extending semiconductor material portions 60' directly contact underlying pedestal semiconductor portions 11' within each of the second support pillar structures 20B, and allow conduction of excess electrical charges in the alternating stack {(132, 142), (232, 242)} and regions of the second retro-stepped dielectric material portion 265 within the proximal segment of the staircase region 200 into the substrate semiconductor layer 10.

According to an embodiment of the present disclosure, the first support pillar structures 20A do not provide a vertically conductive path. The semiconductor oxide plate 13 within each first support pillar structure 20A blocks conduction of excess electrical charges in the alternating stack {(132, 142), (232, 242)} and the retro-stepped dielectric material portions (265, 165) into the substrate semiconductor layer 10. The presence of the semiconductor oxide plate 13 within each first support pillar structure 20A blocks leakage current between the vertically-extending semiconductor material portions 60' and the substrate semiconductor layer 10, thereby reducing noise level during operation of the three-dimensional memory array of the present disclosure. However, the presence of the semiconductor oxide plate 13 within each first support pillar structure 20A has a collateral negative effect of preventing electrical conductive paths during the anisotropic etch process that forms the backside trenches 79.

According to an embodiment of the present disclosure, the threshold separation distance TSD at the processing steps of FIGS. 9A and 9B may be selected such that an optimal result is obtained between reduction of bending of the backside trenches 79 and reduction of the vertical leakage current through the first support pillar structures 20A. In one embodiment, the threshold separation distance TSD at the processing steps of FIGS. 9A and 9B may be within 10% of the width of the second stepped surfaces along the first horizontal direction hd1 and 50% of the width of the second stepped surfaces along the first horizontal direction hd1.

Referring back to FIGS. 17A and 17B, the bending of the backside trenches 79 in the staircase region 200 may be reduced by increasing the distance between the backside trenches 79 and the first and second support pillar structures (20A, 20B). In one embodiment, the most proximal distance between the backside trenches 79 and the first and second support pillar structures (20A, 20B) in the staircase region 200 may be greater than the most proximal distance between the backside trenches 79 and the memory opening fill structures 49 to reduce the bending of the backside trenches 79 in the staircase region 200. In one embodiment, each backside trench 79 may laterally extend along a lengthwise direction (such as the first horizontal direction hd1) through the alternating stack {(132, 142), (232, 242)} and the retro-stepped dielectric material portions (165, 265), the memory openings 49 (and the memory opening fill structures 58 therein) may be arranged in first rows that are parallel to the lengthwise direction of the backside trenches 79, the support openings (19A, 19B) (and the first and second support pillar structures (20A, 20B) therein) may be arranged in second rows that are parallel to the lengthwise direction of the backside trenches 79, and a lateral separation distance (which may be along the second horizontal direction hd2) between a most proximal row of the support openings 19 and each backside trench 79 is greater than a lateral separation distance between a most proximal row of the memory openings 49 and the same backside trench 79, thereby reducing the bending of the backside trenches 79 in the staircase region 200.

Figure 18:
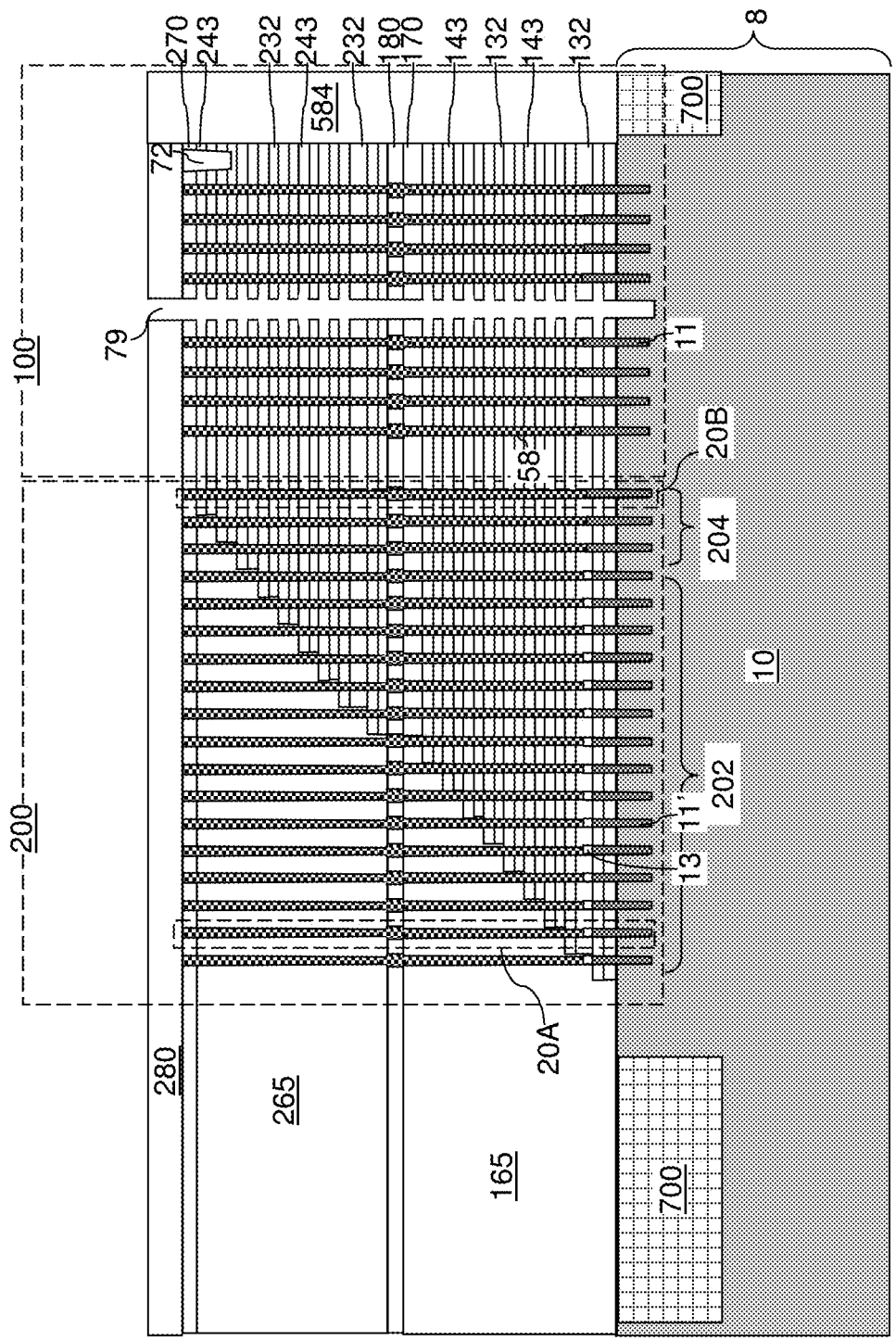
FIG. 18 is a vertical cross-sectional view of the exemplary structure after formation of backside recesses according to an embodiment of the present disclosure.
Figure 19A:
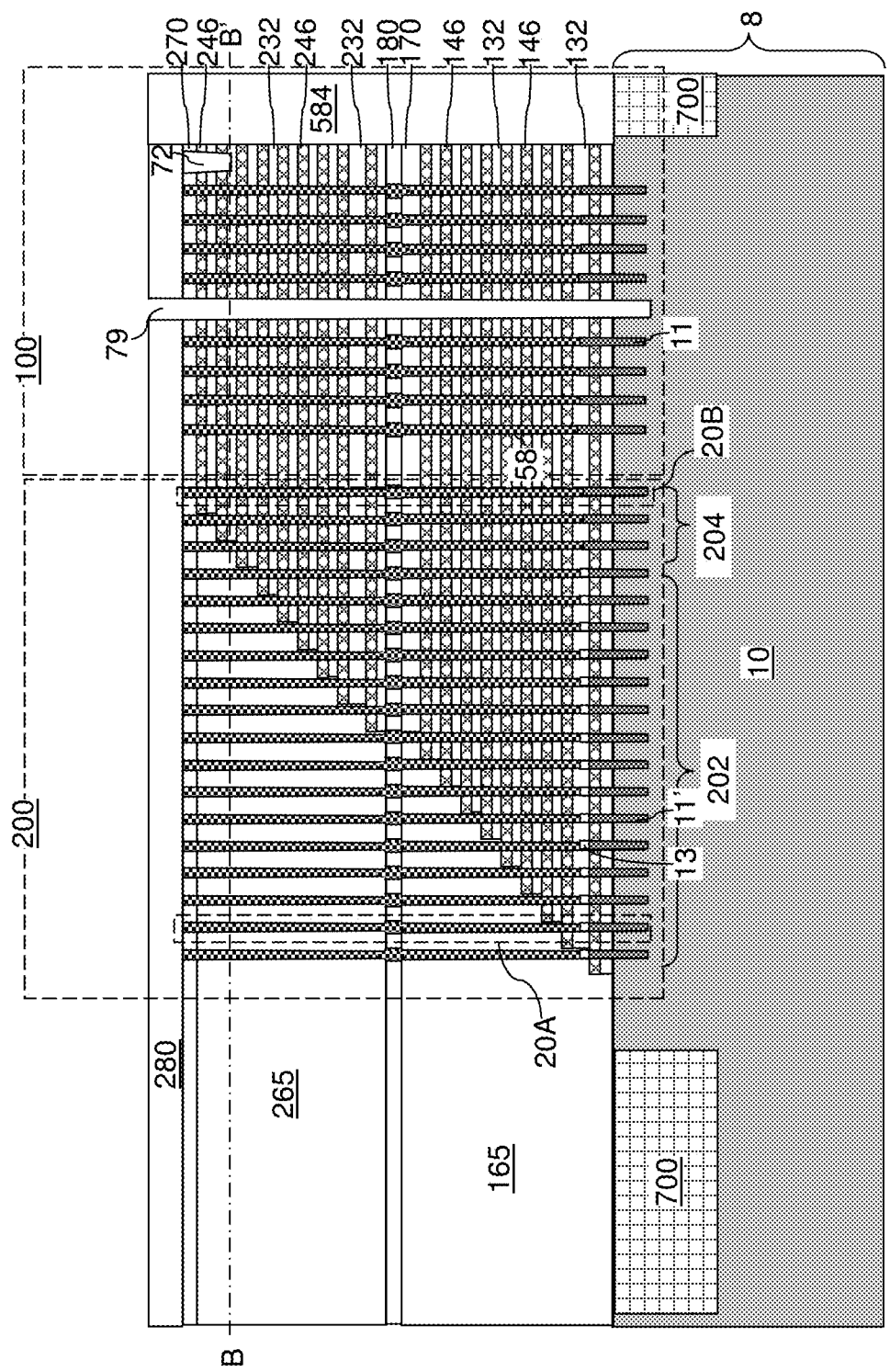
FIG. 19A is a vertical cross-sectional view of the exemplary structure after formation of electrically conductive layers according to an embodiment of the present disclosure.
Figure 19B:
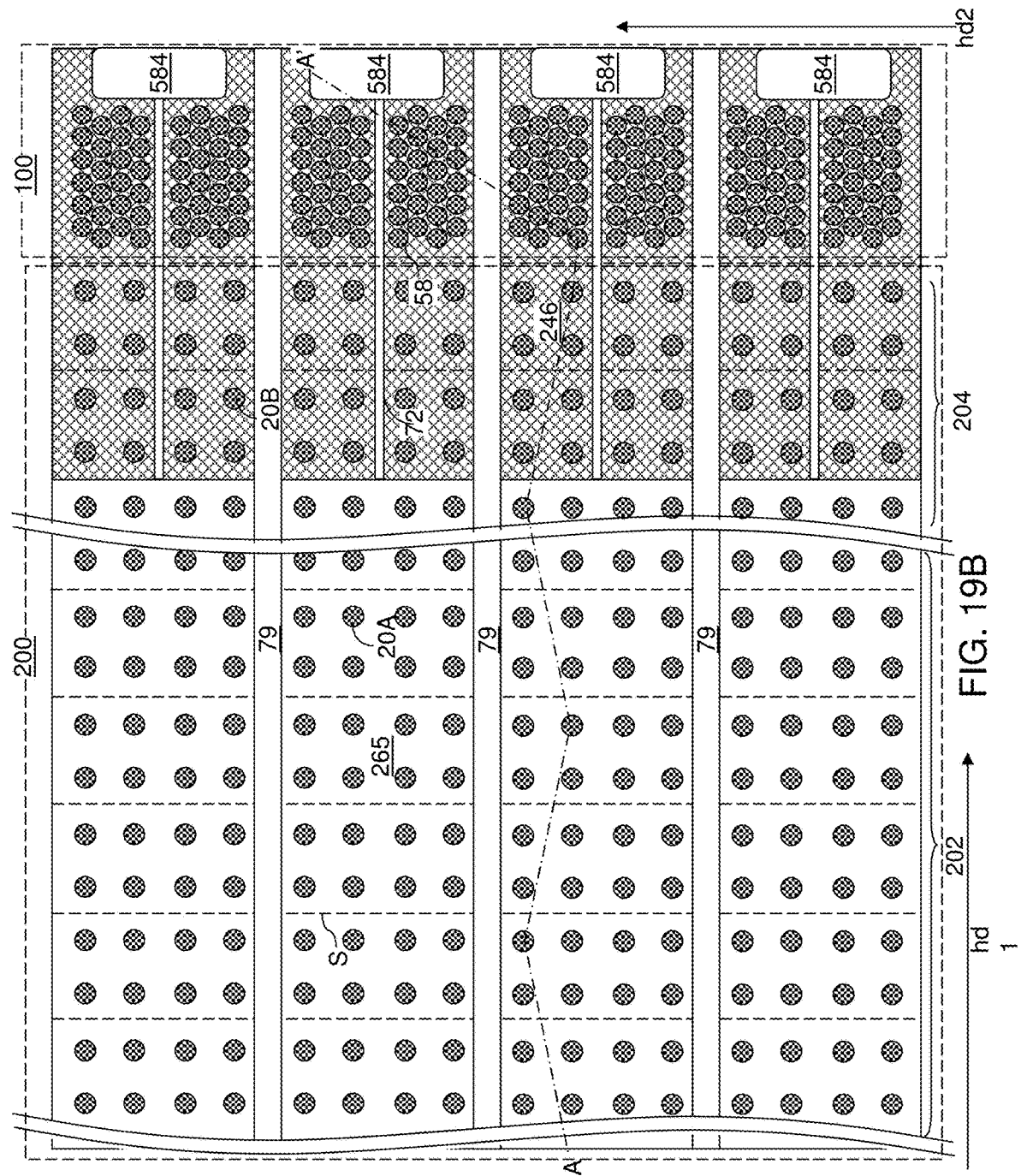
FIG. 19B is a horizontal cross-sectional of the exemplary structure along the horizontal plane B-B' of FIG. 19A. The hinged vertical plane A-A' corresponds to the plane of the vertical cross-sectional view of FIG. 19A.
Figure 19E:
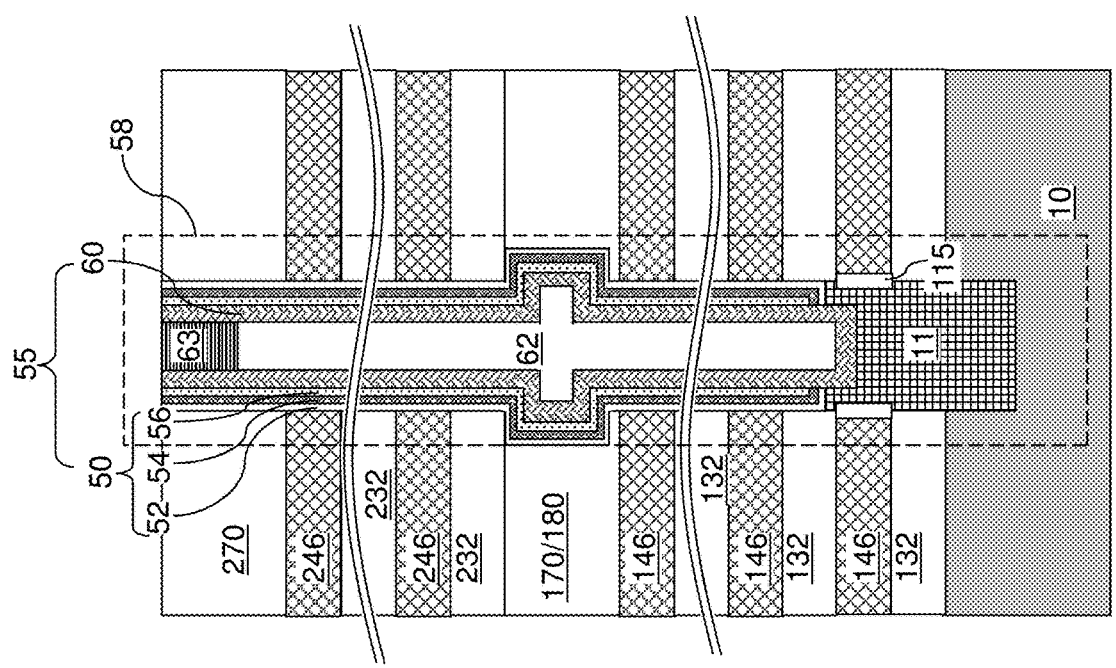
FIG. 19E is a vertical cross-sectional view of a memory opening fill structure at the processing steps of FIGS. 19A and 19B.

Referring to FIG. 18, the sacrificial material layers (142, 242) are may be removed selective to the insulating layers (132, 232), the first and second insulating cap layers (170, 270), the first contact-level dielectric layer 280, and the substrate semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 10. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 19A-19E, an oxidation process may be performed to oxidize physically exposed portions of the pedestal channel portions 11 and the pedestal semiconductor portions 11'. Tubular semiconductor oxide spacers 115 may be formed around each pedestal channel portion 11 and around each pedestal semiconductor portion 11'. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the peripheral device region 400 may comprise word line switch devices configured to control a bias voltage to respective word lines. The memory-level assembly is located over the carrier substrate layer 9. The memory-level assembly includes at least one alternating stack (132, 146, 232, 246) and memory stack structures 55 vertically extending through the at least one alternating stack (132, 146, 232, 246).

Figure 20A:
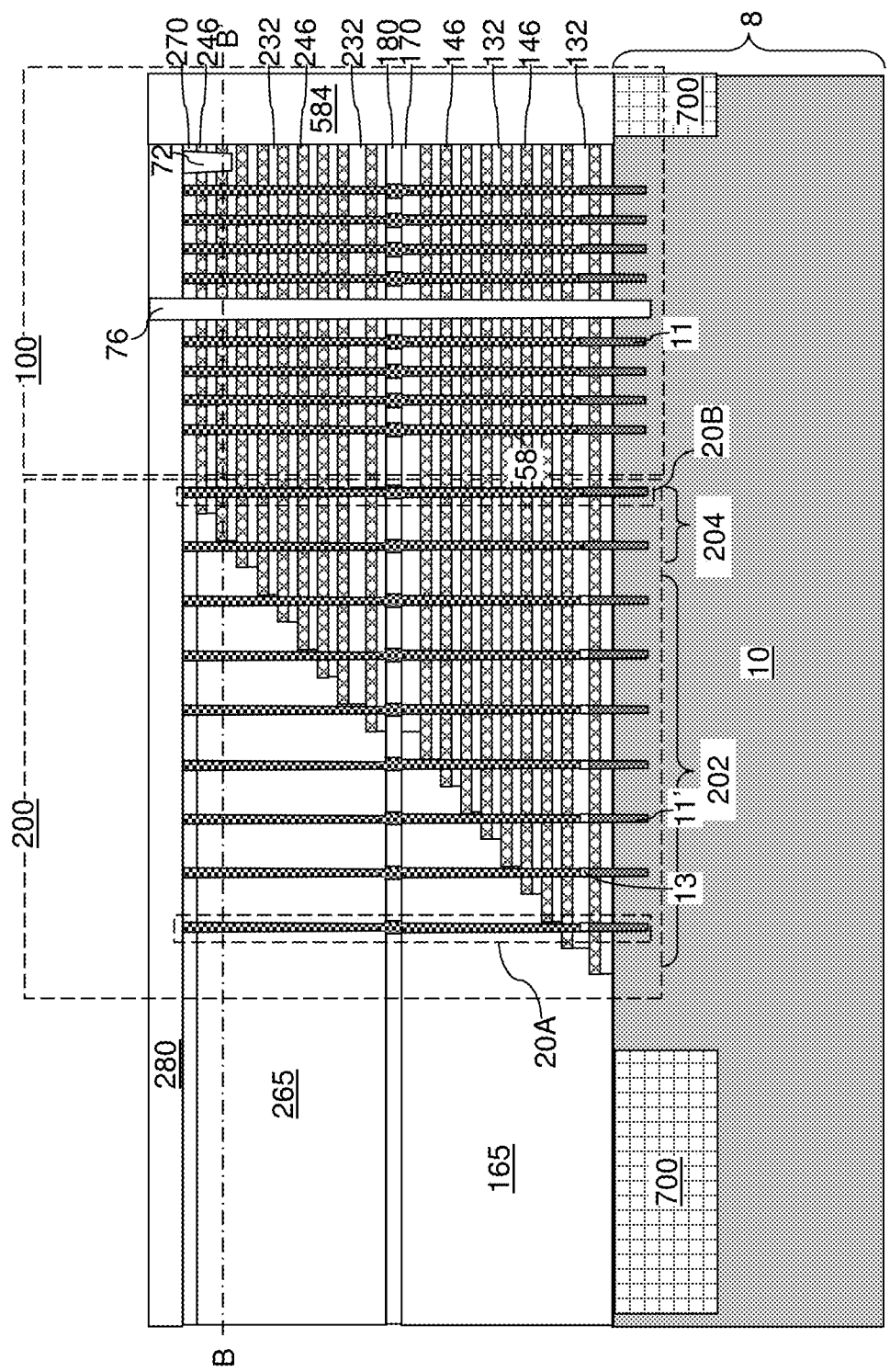
FIG. 20A is a vertical cross-sectional view of the exemplary structure after formation of backside trench fill structures in the backside trenches according to an embodiment of the present disclosure.
Figure 20B:
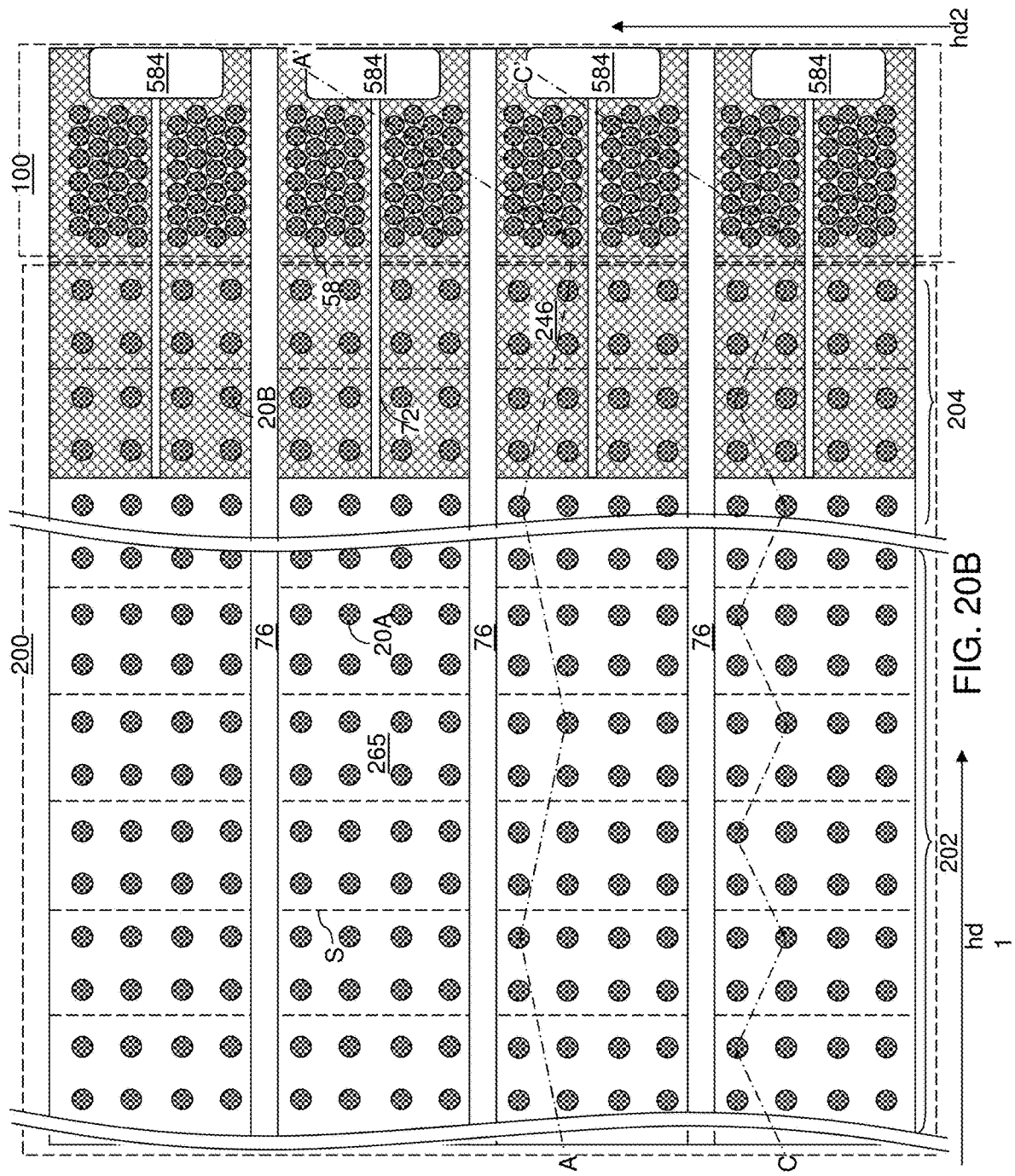
FIG. 20B is a horizontal cross-sectional of the exemplary structure along the horizontal plane B-B' of FIG. 20A. The hinged vertical plane A-A' corresponds to the plane of the vertical cross-sectional view of FIG. 20A.
Figure 20C:
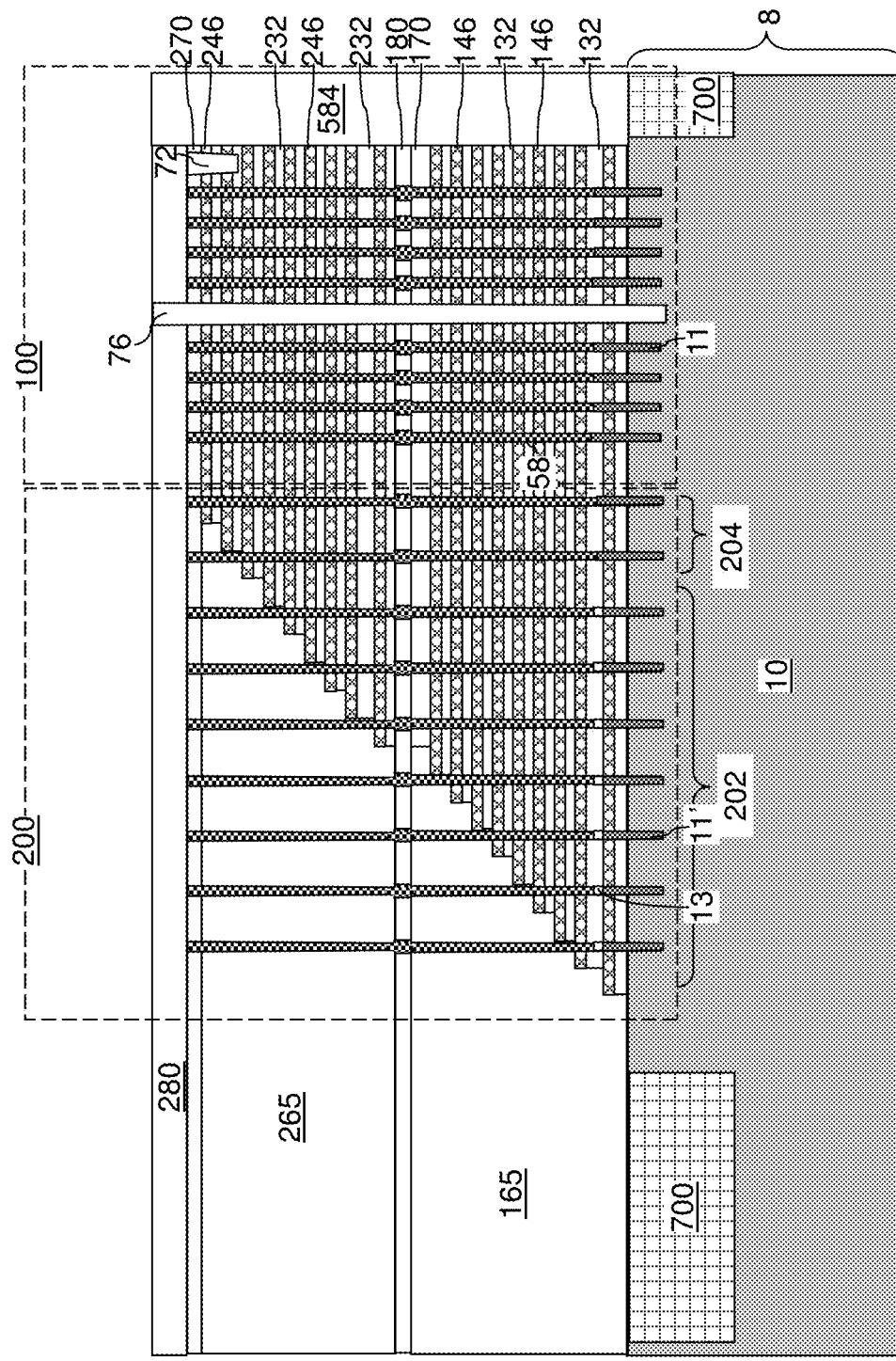
FIG. 20C is a vertical cross-sectional view of the exemplary structure along the vertical plane C-C' of FIG. 20B.

Referring to FIGS. 20A-20C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the substrate semiconductor layer 10 and a dielectric spacer that laterally surrounds the conductive via structure.

Figure 21A:
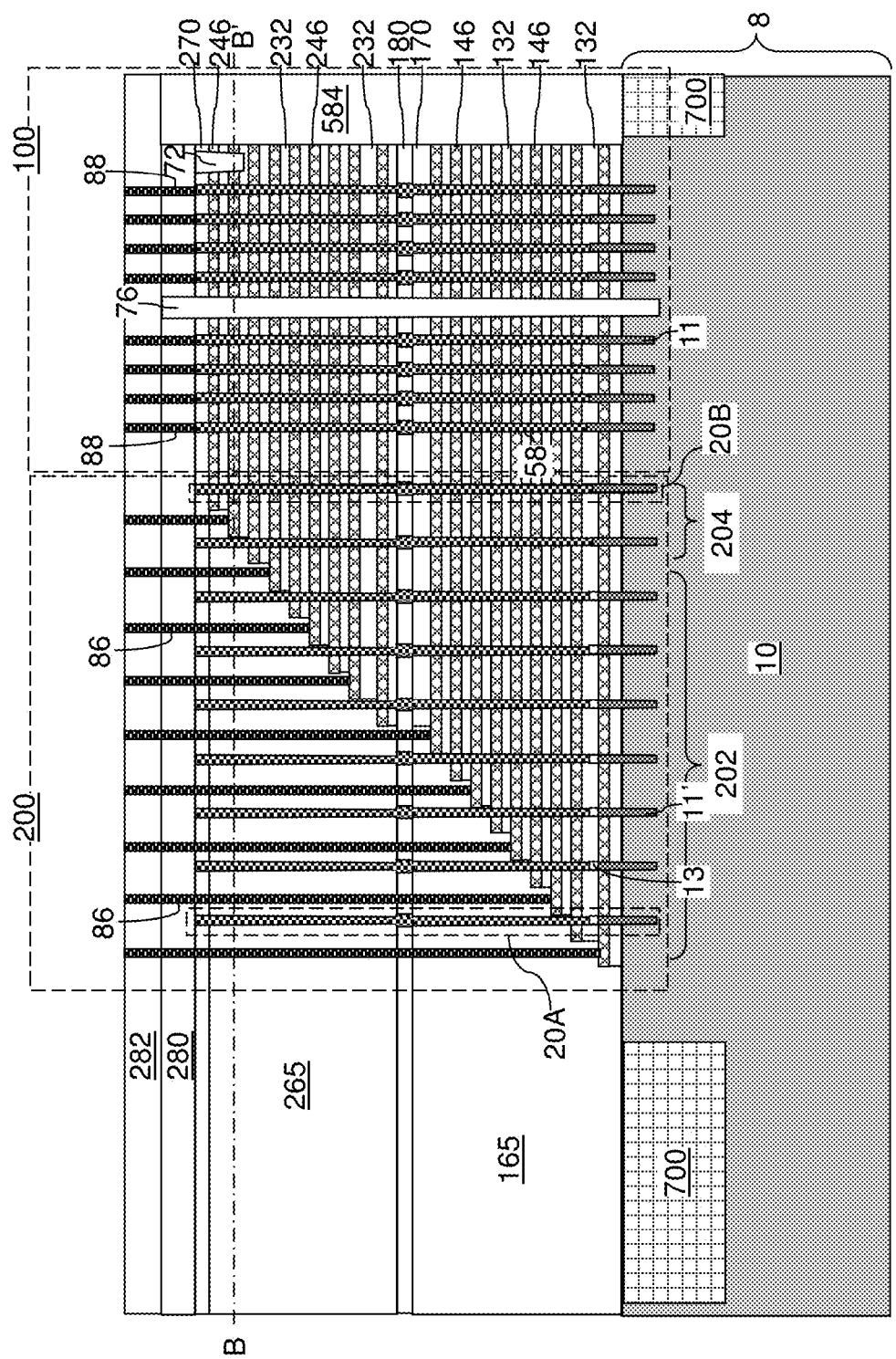
FIG. 21A is a vertical cross-sectional view of the exemplary structure after formation of a second contact-level dielectric layer and various contact via structures according to an embodiment of the present disclosure.

Referring to FIGS. 21A-21C, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 22:
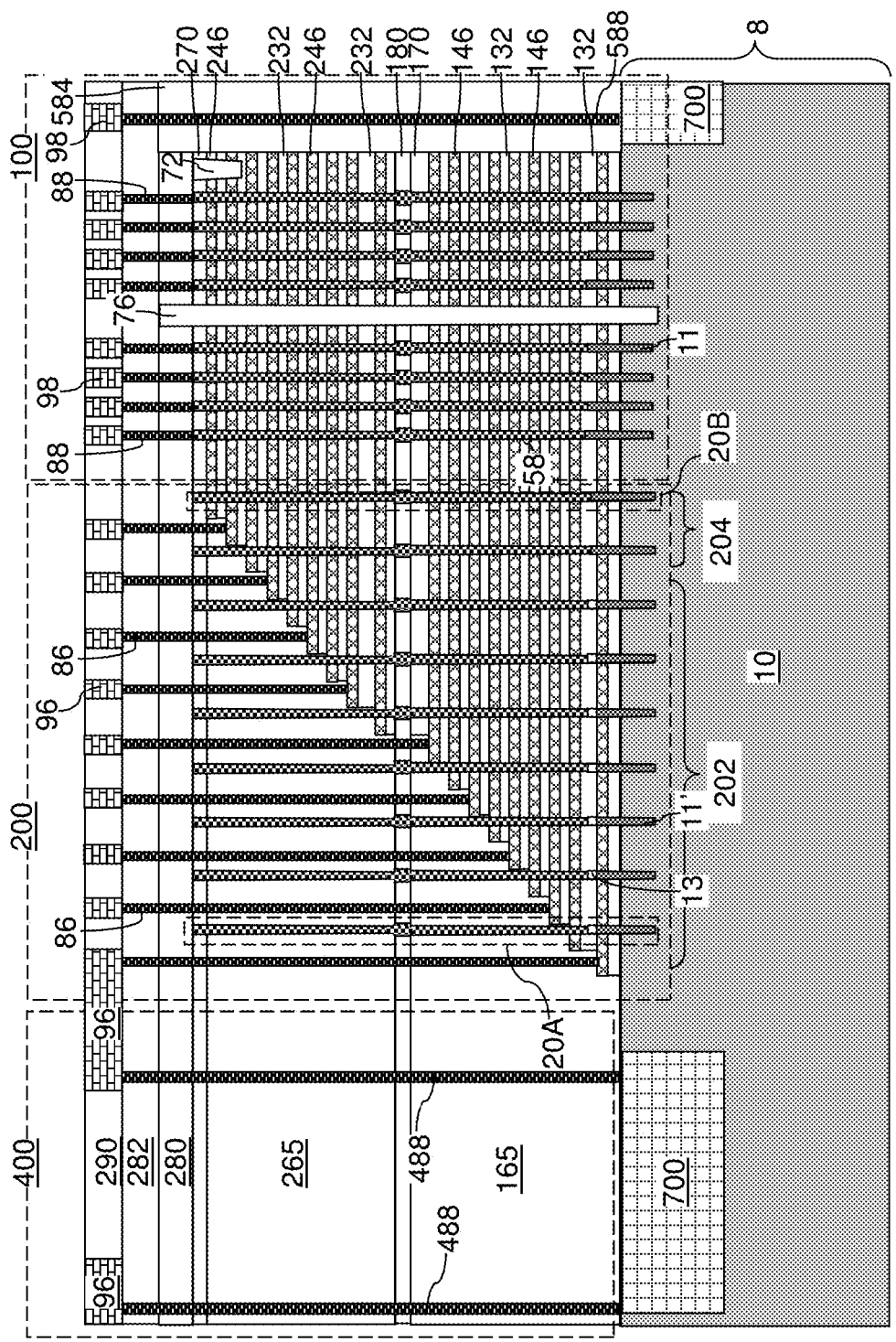
FIG. 22 is a vertical cross-sectional view of the exemplary structure after formation of through-memory-level via structures and upper metal line structures according to an embodiment of the present disclosure.

Referring to FIG. 22, first through-memory-level via cavities may be formed through the second and first contact-level dielectric layers (282, 280) and the second and first stepped dielectric material portions (265, 165) and to a respective one of the peripheral semiconductor devices 700. If the interconnection region dielectric fill material portions 584 and the additional peripheral semiconductor devices 700 are present, then optional second through-memory-level via cavities may be formed through the interconnection region dielectric fill material portions 584 to a respective one of the additional peripheral semiconductor devices 700. At least one conductive material may be deposited in the first through-memory-level via cavities and in the optional second through-memory-level via cavities. Excess portions of the at least one conductive material may be removed from above the horizontal plane including the top surface of the second contact-level dielectric layer 282. Each remaining portion of the at least one conductive material in a first through-memory-level via cavity constitutes a first through-memory-level via structure 488. Each optional remaining portion of the at least one conductive material in a second through-memory-level via cavity constitutes an optional second through-memory-level via structure 588. If the interconnection region dielectric fill material portions 584 and the additional peripheral semiconductor devices 700 are omitted, then the second through-memory-level via structure 588 are also omitted.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the first through-memory-level via structures 488 and/or the optional second through-memory-level via structures 588.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of vertical semiconductor channels 60 that extends substantially perpendicular to a top surface of the substrate 8, and one of the plurality of vertical semiconductor channels 60 including the vertical semiconductor channel 60. The array of monolithic three-dimensional NAND strings comprises a plurality of charge storage elements (comprising portions of the memory films 50), each charge storage element located adjacent to a respective one of the plurality of vertical semiconductor channels 60.

Figure 23A:
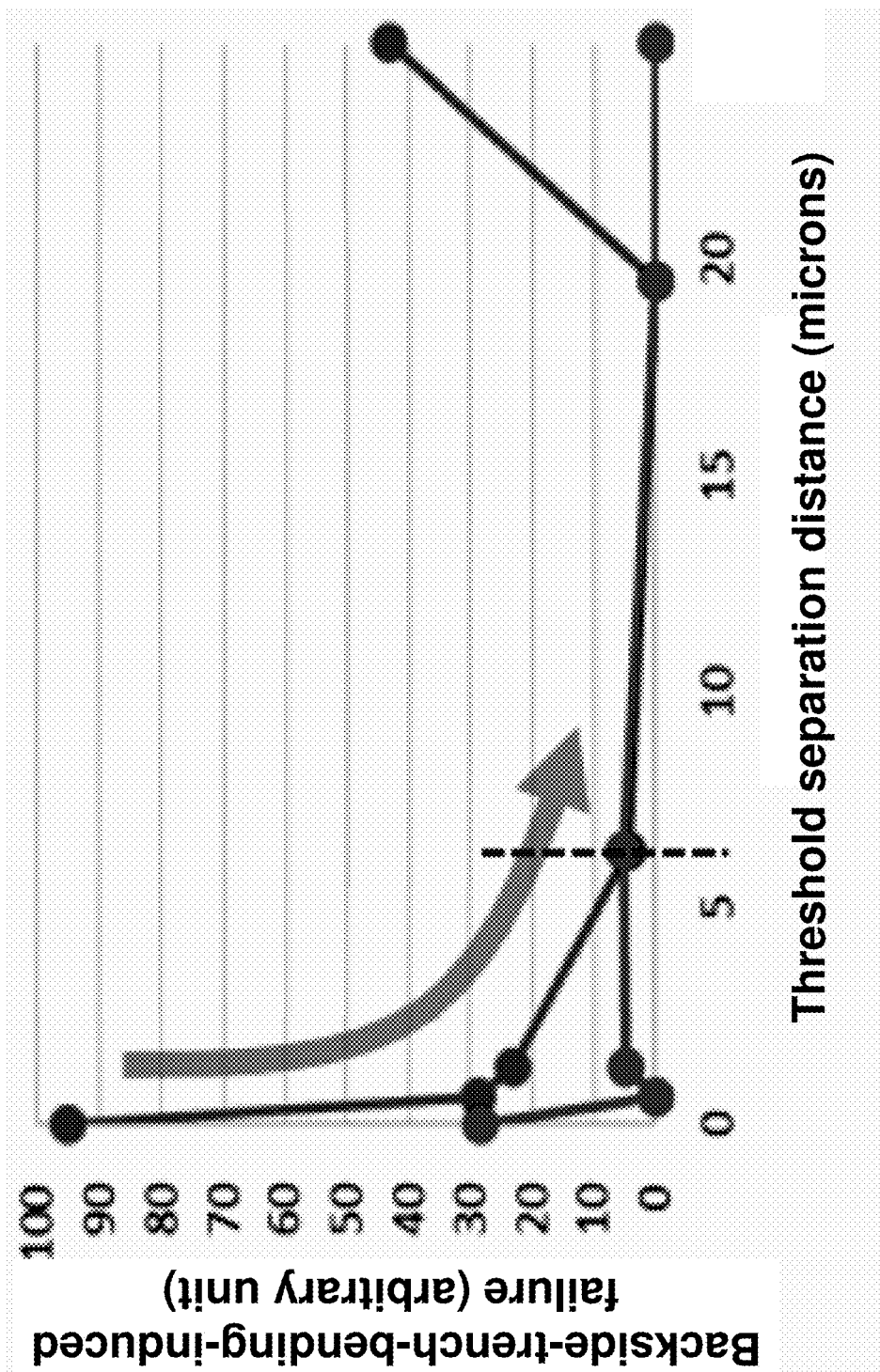
FIG. 23A is a first graph illustrating the dependence of the rate of device failure induced by bending of backside trenches as a function of the threshold separation distance according to an embodiment of the present disclosure.
Figure 23B:
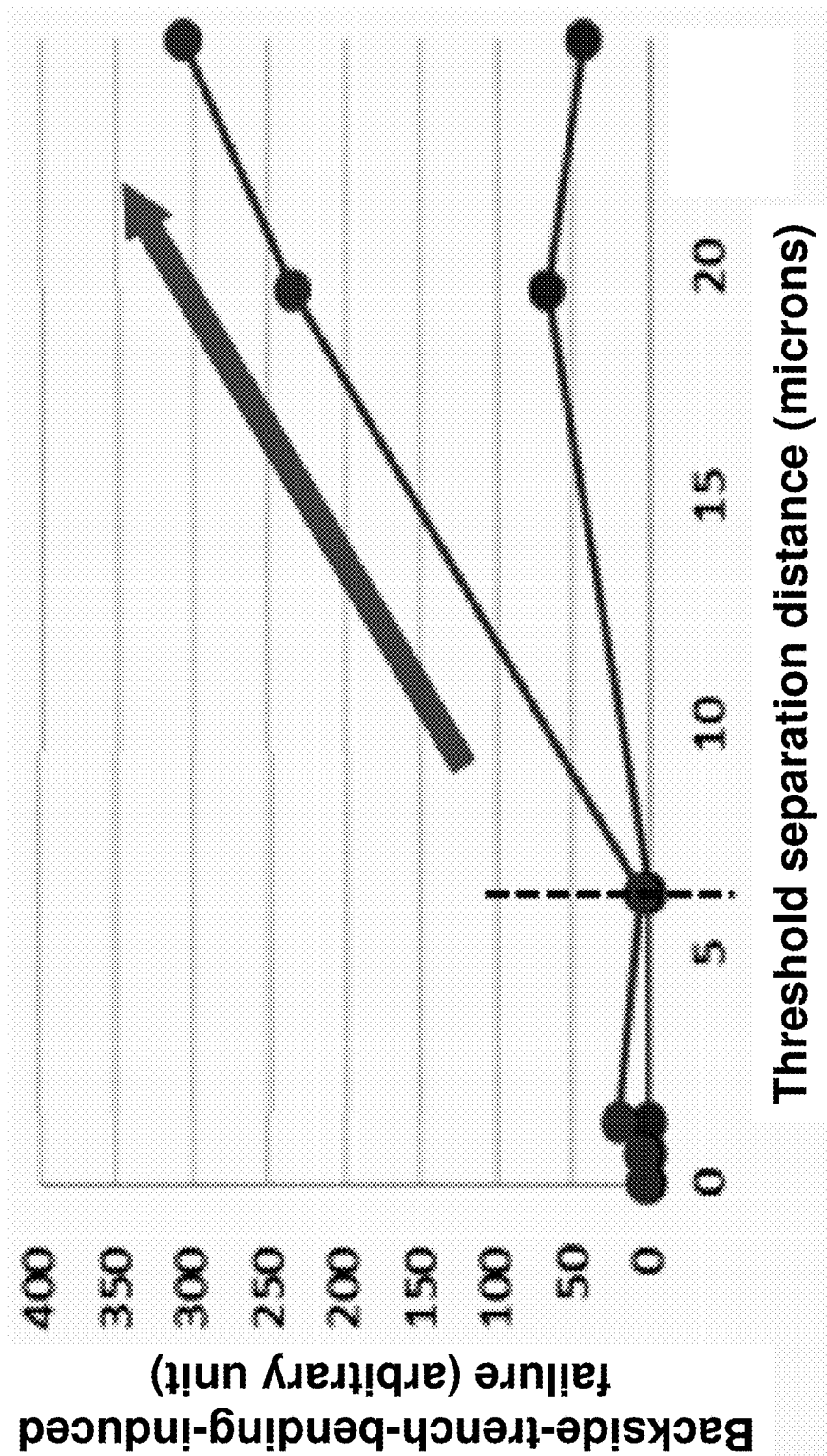
FIG. 23B is a second graph illustrating the dependence of the rate of device failure induced by bending of backside trenches as a function of the threshold separation distance according to an embodiment of the present disclosure.

Referring to FIGS. 23A and 23B, graphs illustrate the rate of device failure induced by bending of backside trenches as a function of the threshold separation distance TSD. The overall rate of device failure induced by bending of backside trenches may be significant when the threshold separation distance TSD is less than 2 microns or greater than 15 microns in the data illustrated in FIGS. 23A and 23B. Generally, the optimal range for the threshold separation distance TSD depends on the total height of the alternating stack {(132, 146), (232, 246)} and the total number of electrically conductive layers (146, 246) within the alternating stack {(132, 146), (232, 246)}. Generally, a threshold separation distance TSD that is shorter than the optimal range for the threshold separation distance TSD may result in an increase in device failure due to bending of the backside trenches, while a threshold separation distance TSD that is longer than the optimal range for the threshold separation distance TSD may result in an increase in device failure due to leakage current through the second support pillar structures 20B in which the vertically-extending semiconductor material portions 60' directly contact an underlying pedestal semiconductor portion 11'. Embodiments of the present disclosure provide enhanced device yield by suppressing both the bending of the backside trenches 79 and the leakage current through support pillar structures 20 to respective acceptable levels.

Referring to all drawings and according to various embodiments of the present disclosure, a three-dimensional memory device is provided: an alternating stack of insulating layers (132, 232) and electrically conductive layers (146, 246) located over a substrate 8 and having stepped surfaces in a staircase region 200; a retro-stepped dielectric material portion (165 and/or 265) overlying the stepped surfaces of the alternating stack {(132, 246), (232, 246)} in the staircase region 200; memory opening fill structures 58 extending through the alternating stack {(132, 246), (232, 246)} in a memory array region 100, wherein each of the memory opening fill structures 58 comprises a memory stack structure 55; first support pillar structures 20A extending through the alternating stack {(132, 246), (232, 246)} and the retro-stepped dielectric material portion (165 and/or 265) in a first section of the staircase region 200; and second support pillar structures 28B extending through the alternating stack {(132, 246), (232, 246)} and the retro-stepped dielectric material portion (165 and/or 265) in a second section of the staircase region 200, wherein each of the first support pillar structures 20A and the second support pillar structures 20B comprises a respective pedestal semiconductor portion 11' and a respective dielectric layer stack 50' overlying the respective pedestal semiconductor portion 11'; wherein each pedestal semiconductor portion 11' of the first support pillar structures 20A is vertically spaced from an overlying one of the dielectric layer stacks 50' by a respective semiconductor oxide plate 13; and wherein each pedestal semiconductor portion 11' of the second support pillar structures 20B directly contacts a bottom surface of an overlying one of the dielectric layer stacks 55'.

In one embodiment, the second section of the staircase region 200 is located between the first section and the memory array region 100.

In one embodiment, each of the second support pillar structures 20B vertically extends through a greater number of the electrically conductive layers (146, 246) in the alternating stack {(132, 246), (232, 246)} than a total number of electrically conductive layers (146, 246) that the first support pillar structures 20A vertically extend through.

In one embodiment, each memory stack structure 55 comprises a memory film 50 and a vertical semiconductor channel 60; and each of the memory opening fill structures 58 comprises a pedestal channel portion 11 contacting a respective one of the memory films 50.

In one embodiment, each of the memory films 50 comprises a charge storage layer 54 and a tunneling dielectric layer 56; and each of the dielectric layer stacks 50' of the first support pillar structures 20A and the second support pillar structures 20B comprises a material layer (such as a charge storage layer 54 within a respective support pillar structure (20A or 20B)) having a same composition and a same thickness as the charge storage layer 54, and another material layer (such as a tunneling dielectric layer 56 within a respective support pillar structure (20A or 20B)) having a same composition and a same thickness as the tunneling dielectric layer 56.

In one embodiment, each of the first support pillar structures 20A and the second support pillar structures 20B comprises a respective vertically-extending semiconductor material portion 60' having a same composition as the vertical semiconductor channels 60 in the memory stack structures 55.

In one embodiment, each vertically-extending semiconductor material portion 60' in the first support pillar structures 20A is vertically spaced from an underlying one of the pedestal semiconductor portions 11' by a respective one of the semiconductor oxide plates 13; and each vertically-extending semiconductor material portion 60' in the second support pillar structures 20B contacts an underlying one of the pedestal semiconductor portions 11'.

In one embodiment, each of the pedestal semiconductor portions 11' of the first support pillar structures 20A and the second support pillar structures 20B and each of the pedestal channel portions 11 in the memory opening fill structures 58 contact a semiconductor material layer (such as the substrate semiconductor layer 10) that underlies the alternating stack {(132, 246), (232, 246)}.

In one embodiment, the semiconductor material layer (such as the substrate semiconductor layer 10) comprises a single crystalline semiconductor material; and each of the pedestal semiconductor portions 11' of the first support pillar structures 20A and the second support pillar structures 20B and each of the pedestal channel portions 11 in the memory opening fill structures 58 include a respective single crystalline semiconductor material that is epitaxially aligned to the single crystalline semiconductor material of the semiconductor material layer.

In one embodiment, the three-dimensional memory device comprises: a backside trench 79 vertically extending through the alternating stack {(132, 246), (232, 246)} and the retro-stepped dielectric material portion (165 and/or 265); and a backside trench fill material portion 76 located within the backside trench 79 and vertically extending at least from a horizontal plane including a topmost surface of the alternating stack {(132, 246), (232, 246)} to the semiconductor material layer.

In one embodiment, the memory opening fill structures 58 are arranged in first rows that are parallel to a lengthwise direction of the backside trench 79; the first support pillar structures 20A and the second support pillar structures 20B are arranged in second rows that are parallel to the lengthwise direction of the backside trench 79; and a lateral separation distance between a most proximal row of the first support pillar structures 20A and the second support pillar structures 20B and the backside trench 79 is greater than a lateral separation distance between a most proximal row of the memory opening fill structures 58 and the backside trench 79.

In one embodiment, each of the pedestal semiconductor portions 11' of the first support pillar structures 20A and the second support pillar structures 20B is electrically isolated from a bottommost one of the electrically conductive layers (i.e., a bottommost one of the first electrically conductive layers 146) by a respective tubular semiconductor oxide spacer 115.

In one embodiment, a lateral separation distance between the first support pillar structures 20A and an interface between the retro-stepped dielectric material portion (165 and 265) and a topmost electrically conductive layer (such as a topmost one of the second electrically conductive layers 246) within the alternating stack {(132, 146), (232, 246)} is in a range from 2 microns to 15 microns.

In one embodiment, at least three topmost electrically conductive layers (such as at least three topmost ones of the second electrically conductive layers 246) within the alternating stack {(132, 146), (232, 246)} are laterally spaced from each of the first support pillar structures 20A, and do not laterally surround any of the first support pillar structures 20A.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate and having stepped surfaces in a staircase region;
   a retro-stepped dielectric material portion overlying the stepped surfaces of the alternating stack in the staircase region;
   memory opening fill structures extending through the alternating stack in a memory array region, wherein each of the memory opening fill structures comprises a memory stack structure comprising a memory film and a vertical semiconductor channel;
   first support pillar structures extending through the alternating stack and the retro-stepped dielectric material portion in a first section of the staircase region; and
   second support pillar structures extending through the alternating stack and the retro-stepped dielectric material portion in a second section of the staircase region,
   wherein each of the first support pillar structures and the second support pillar structures comprises a respective pedestal semiconductor portion and a respective dielectric layer stack overlying the respective pedestal semiconductor portion;
   wherein each pedestal semiconductor portion of the first support pillar structures is vertically spaced from an overlying one of the dielectric layer stacks by a respective semiconductor oxide plate; and
   wherein each pedestal semiconductor portion of the second support pillar structures directly contacts a bottom surface of an overlying one of the dielectric layer stacks.

2. The three-dimensional memory device of claim 1, wherein the second section of the staircase region is located between the first section and the memory array region.

3. The three-dimensional memory device of claim 1, wherein each of the second support pillar structures vertically extends through a greater number of the electrically conductive layers in the alternating stack than a total number of electrically conductive layers that the first support pillar structures vertically extend through.

4. The three-dimensional memory device of claim 1, wherein each of the memory opening fill structures comprises a pedestal channel portion contacting a respective one of the memory films.

5. The three-dimensional memory device of claim 4, wherein:
   each of the memory films comprises a charge storage layer and a tunneling dielectric layer; and
   each of the dielectric layer stacks of the first support pillar structures and the second support pillar structures comprises a material layer having a same composition and a same thickness as the charge storage layer and another material layer having a same composition and a same thickness as the tunneling dielectric layer.

6. The three-dimensional memory device of claim 4, wherein each of the first support pillar structures and the second support pillar structures comprises a respective vertically-extending semiconductor material portion having a same composition as the vertical semiconductor channels in the memory stack structures.

7. The three-dimensional memory device of claim 6, wherein:
each vertically-extending semiconductor material portion in the first support pillar structures is vertically spaced from an underlying one of the pedestal semiconductor portions by a respective one of the semiconductor oxide plates; and
each vertically-extending semiconductor material portion in the second support pillar structures contacts an underlying one of the pedestal semiconductor portions.

8. The three-dimensional memory device of claim 4, wherein each of the pedestal semiconductor portions of the first support pillar structures and the second support pillar structures and each of the pedestal channel portions in the memory opening fill structures contact a semiconductor material layer that underlies the alternating stack.

9. The three-dimensional memory device of claim 8, wherein:
the semiconductor material layer comprises a single crystalline semiconductor material; and
each of the pedestal semiconductor portions of the first support pillar structures and the second support pillar structures and each of the pedestal channel portions in the memory opening fill structures include a respective single crystalline semiconductor material that is epitaxially aligned to the single crystalline semiconductor material of the semiconductor material layer.

10. The three-dimensional memory device of claim 1, further comprising:
a backside trench vertically extending through the alternating stack and the retro-stepped dielectric material portion; and
a backside trench fill material portion located within the backside trench and vertically extending at least from a horizontal plane including a topmost surface of the alternating stack to the semiconductor material layer.

11. The three-dimensional memory device of claim 10, wherein:
the memory opening fill structures are arranged in first rows that are parallel to a lengthwise direction of the backside trench;
the first support pillar structures and the second support pillar structures are arranged in second rows that are parallel to the lengthwise direction of the backside trench; and
a lateral separation distance between a most proximal row of the first support pillar structures and the second support pillar structures from the backside trench is greater than a lateral separation distance between a most proximal row of the memory opening fill structures.

12. The three-dimensional memory device of claim 1, wherein each of the pedestal semiconductor portions of the first support pillar structures and the second support pillar structures is electrically isolated from a bottommost one of the electrically conductive layers by a respective tubular semiconductor oxide spacer.

13. The three-dimensional memory device of claim 1, wherein a lateral separation distance between the first support pillar structures and an interface between the retro-stepped dielectric material portion and a topmost electrically conductive layer within the alternating stack is in a range from 2 microns to 15 microns.

14. The three-dimensional memory device of claim 1, wherein at least three topmost electrically conductive layers within the alternating stack are laterally spaced from each of the first support pillar structures, and do not laterally surround any of the first support pillar structures.

15. A method of forming a three-dimensional memory device, comprising:
forming an alternating stack of insulating layers and spacer material layers over a substrate;
patterning the alternating stack to form stepped surfaces in a staircase region;
forming a retro-stepped dielectric material portion over the stepped surfaces of the alternating stack in the staircase region;
forming memory opening and support openings through a combination of the alternating stack and the retro-stepped dielectric material portion, wherein the memory openings are formed in a memory array region in which each layer of the alternating stack is present, and wherein the support openings are formed in the staircase region;
forming a pedestal semiconductor portion at a bottom of each support opening and a pedestal channel portion at a bottom of each memory opening;
forming a semiconductor oxide plate on top of each of the pedestal semiconductor portions and the pedestal channel portions;
removing semiconductor oxide plates that are located in the memory openings and in a proximal subset of the support openings laterally spaced from the memory array region by less than a threshold separation distance without removing semiconductor oxide plates that are located in a distal subset of the support openings laterally spaced from the memory array region by a distance greater than the threshold separation distance; and
forming first support pillar structures in the distal subset of the support openings and second support pillar structures in the proximal subset of the support openings.

16. The method of claim 15, wherein:
each of the first support pillar structures and the second support pillar structures comprises a respective pedestal semiconductor portion and a respective dielectric layer stack overlying the respective pedestal semiconductor portion;
each pedestal semiconductor portion of the first support pillar structures is vertically spaced from an overlying one of the dielectric layer stacks by a respective semiconductor oxide plate; and
each pedestal semiconductor portion of the second support pillar structures directly contacts a bottom surface of an overlying one of the dielectric layer stacks.

17. The method of claim 16, further comprising:
covering a distal segment of the staircase region with a patterned mask layer, wherein the patterned mask layer has an edge that is laterally spaced from an interface between the retro-stepped dielectric material portion and a topmost layer within the alternating stack by the threshold separation distance, wherein the semiconductor oxide plates that are located in the memory openings or in the proximal subset of the support openings are not masked by the patterned mask layer; and
etching the semiconductor oxide plates that are not masked by the patterned mask layer selective to a material of the pedestal semiconductor portions and the pedestal channel portions while the patterned mask layer is present.

18. The method of claim 16, further comprising forming memory opening fill structures in each of the memory openings, wherein:

each of the memory opening fill structures comprises a respective pedestal channel portion and a respective memory stack structure;

each memory stack structure comprises a memory film and a vertical semiconductor channel;

each of the memory films comprises a charge storage layer and a tunneling dielectric layer; and each of the dielectric layer stacks of the first support pillar structures and the second support pillar structures comprises a material layer having a same composition and a same thickness as the charge storage layer and another material layer having a same composition and a same thickness as the tunneling dielectric layer.

19. The method of claim 15, further comprising forming a backside trench that laterally extends along a lengthwise direction through the alternating stack and the retro-stepped dielectric material portion, wherein:

the memory openings are arranged in first rows that are parallel to the lengthwise direction of the backside trench;

the support openings are arranged in second rows that are parallel to the lengthwise direction of the backside trench; and a lateral separation distance between a most proximal row of the support openings and the backside trench is greater than a lateral separation distance between a most proximal row of the memory openings and the backside trench.

20. The method of claim 19, further comprising:

forming memory opening fill structures in the memory openings, wherein each of the memory opening fill structures comprises a respective one of the pedestal channel portions, a memory film, and a vertical semiconductor channel that contacts the respective one of the pedestal channel portions;

forming backside recesses by removing remaining portions of the spacer material layers using the backside trench as a conduit for an etchant; and forming electrically conductive layers by depositing at least one conductive material using the backside trench as a conduit for a precursor material for deposition of the at least one conductive material.

* * * * *